United States Patent
Yuda et al.

(10) Patent No.: US 7,705,812 B2
(45) Date of Patent: Apr. 27, 2010

(54) LIQUID CRYSTAL DISPLAY DEVICE HAVING A DRIVE IC MOUNTED ON A FLEXIBLE BOARD DIRECTLY CONNECTED TO A LIQUID CRYSTAL PANEL

(75) Inventors: Takashi Yuda, Kawasaki (JP); Satoshi Sekido, Kawasaki (JP); Syouichi Fukutoku, Kawasaki (JP)

(73) Assignee: Sharp Kabushiki Kaisha, Osaka (JP)

( * ) Notice: Subject to any disclaimer, the term of this patent is extended or adjusted under 35 U.S.C. 154(b) by 1198 days.

(21) Appl. No.: 11/226,153

(22) Filed: Sep. 14, 2005

(65) Prior Publication Data

US 2006/0055649 A1 Mar. 16, 2006

Related U.S. Application Data

(62) Division of application No. 10/100,817, filed on Mar. 19, 2002, now abandoned.

(30) Foreign Application Priority Data

| May 31, 2001 | (JP) | ............................ 2001-165564 |
| Sep. 28, 2001 | (JP) | ............................ 2001-302987 |
| Dec. 20, 2001 | (JP) | ............................ 2001-388173 |

(51) Int. Cl.
G09G 3/36 (2006.01)
G09G 5/00 (2006.01)
G06F 3/038 (2006.01)

(52) U.S. Cl. ........................................ 345/87; 345/206

(58) Field of Classification Search .................. 345/87, 345/206; 349/149
See application file for complete search history.

(56) References Cited

U.S. PATENT DOCUMENTS

| 5,592,199 | A | * | 1/1997 | Kawaguchi et al. | ......... 345/206 |
| 5,670,994 | A | | 9/1997 | Kawaguchi et al. | ......... 345/206 |
| 5,777,610 | A | | 7/1998 | Sugimoto et al. | |
| 6,639,589 | B1 | * | 10/2003 | Kim et al. | .................... 345/206 |

FOREIGN PATENT DOCUMENTS

| JP | 05-333358 | 12/1993 |
| JP | 6-202132 | 7/1994 |
| JP | 6-231814 | 8/1994 |
| JP | 06-250199 | 9/1994 |
| JP | 6-258651 | 9/1994 |
| JP | 6-258653 | 9/1994 |

(Continued)

*Primary Examiner*—Sumati Lefkowitz
*Assistant Examiner*—Charles Hicks
(74) *Attorney, Agent, or Firm*—Greer, Burns & Crain, Ltd.

(57) ABSTRACT

A liquid crystal display apparatus including a glass substrate having a liquid display part formed thereon and a plurality of flexible boards connected to a periphery of the glass substrate. The apparatus also includes a liquid crystal drive IC mounted on each of the flexible boards so as to generate liquid crystal drive signals based on input signals. Additionally, the glass substrate has first internal lines and second internal lines. The first internal lines supply the input signals supplied from a first one of the flexible boards to a second one of the flexible boards, and the second internal lines return the input signals supplied from the first one of the flexible boards back to the first one of the flexible boards without any change.

7 Claims, 39 Drawing Sheets

FOREIGN PATENT DOCUMENTS

| | | |
|---|---|---|
| JP | 7-49657 | 2/1995 |
| JP | 07-140482 | 6/1995 |
| JP | 7-183634 | 7/1995 |
| JP | 8-262468 | 10/1996 |
| JP | 9-179137 | 7/1997 |
| JP | 9-211481 | 8/1997 |
| JP | 10-10564 | 1/1998 |
| JP | 10-73838 | 3/1998 |
| JP | 11-316386 | 11/1999 |
| JP | 3054135 | 4/2000 |
| JP | 2000-227783 | 8/2000 |
| JP | 2001-42788 | 2/2001 |
| JP | 2001-188246 | 7/2001 |

* cited by examiner

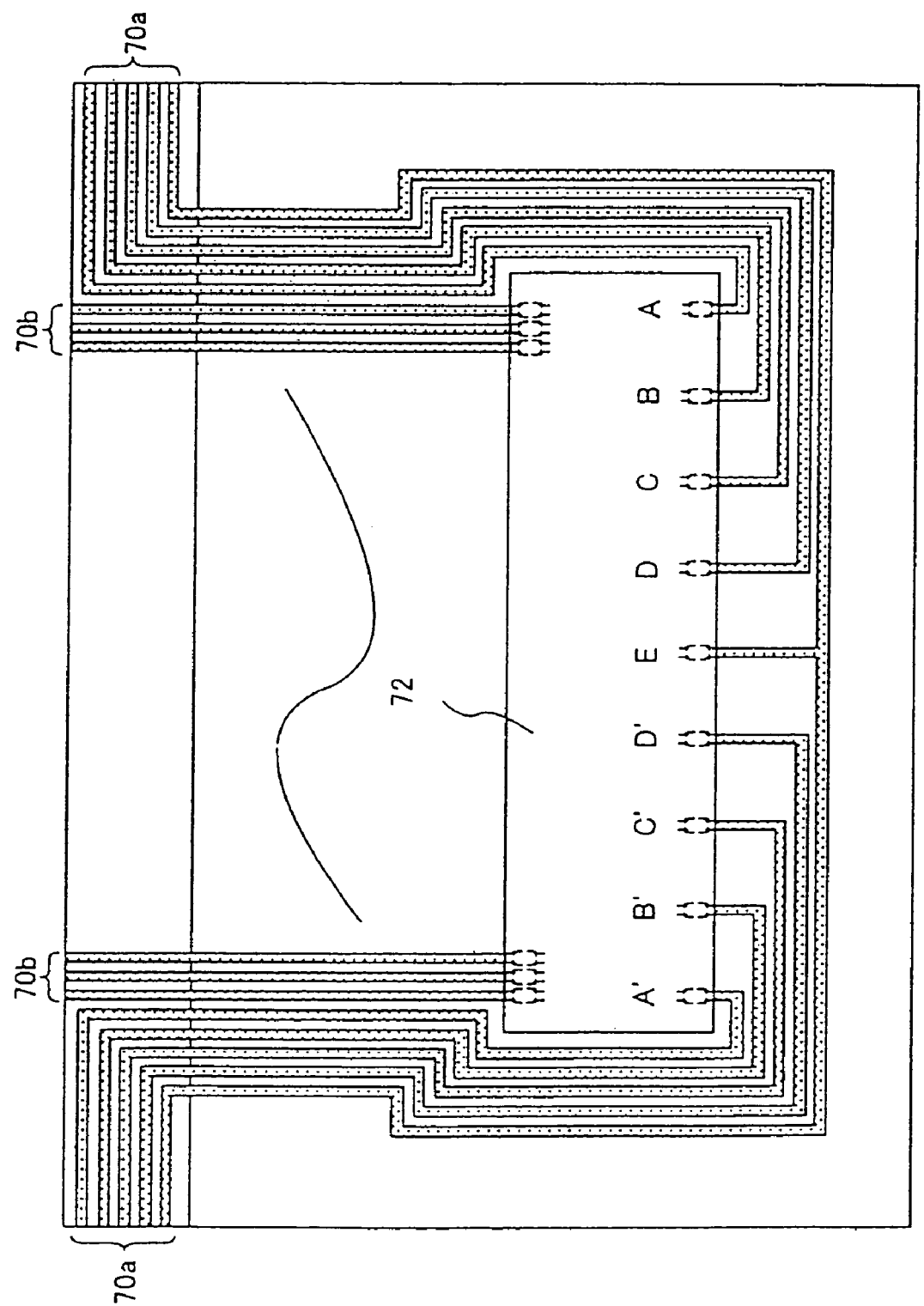

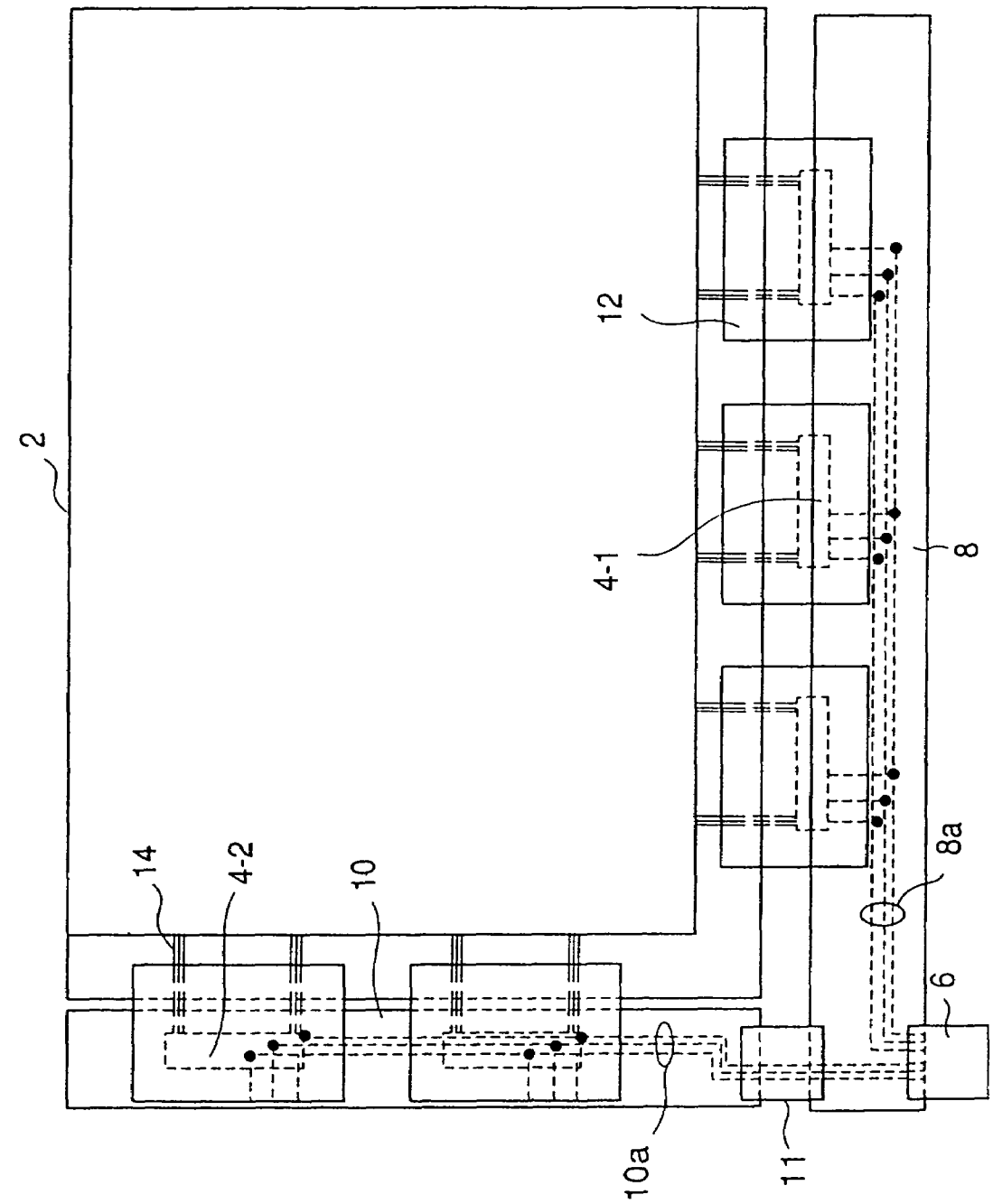

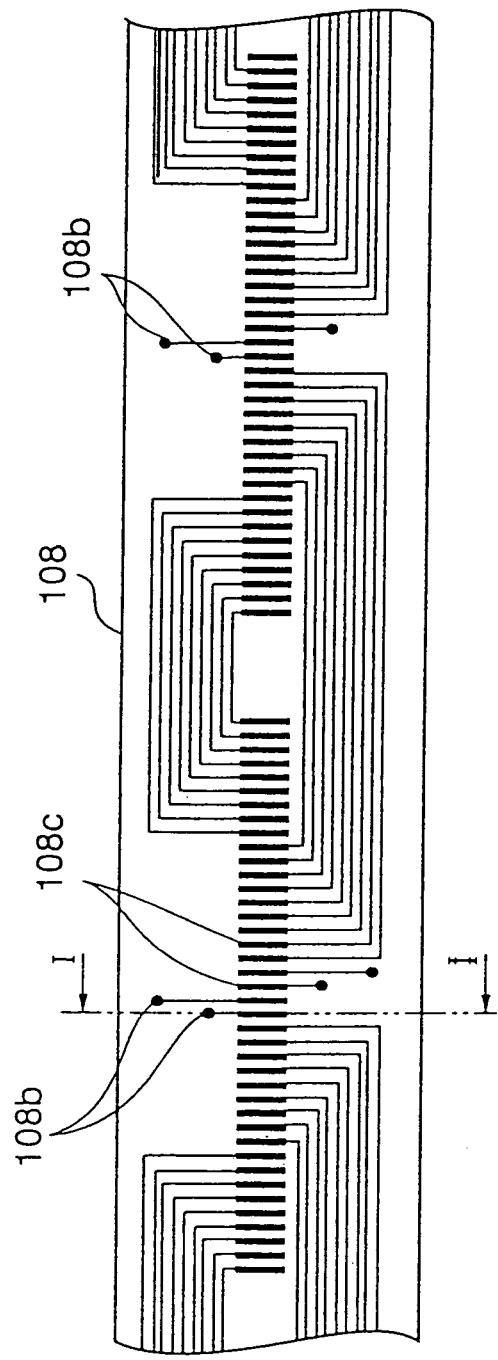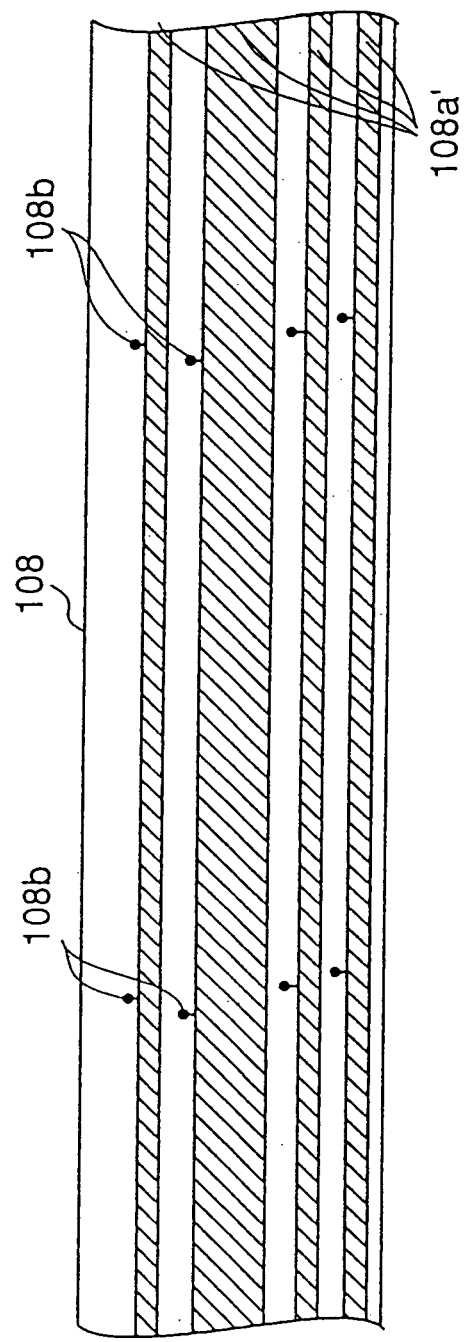
FIG. 31A
FIG. 31B

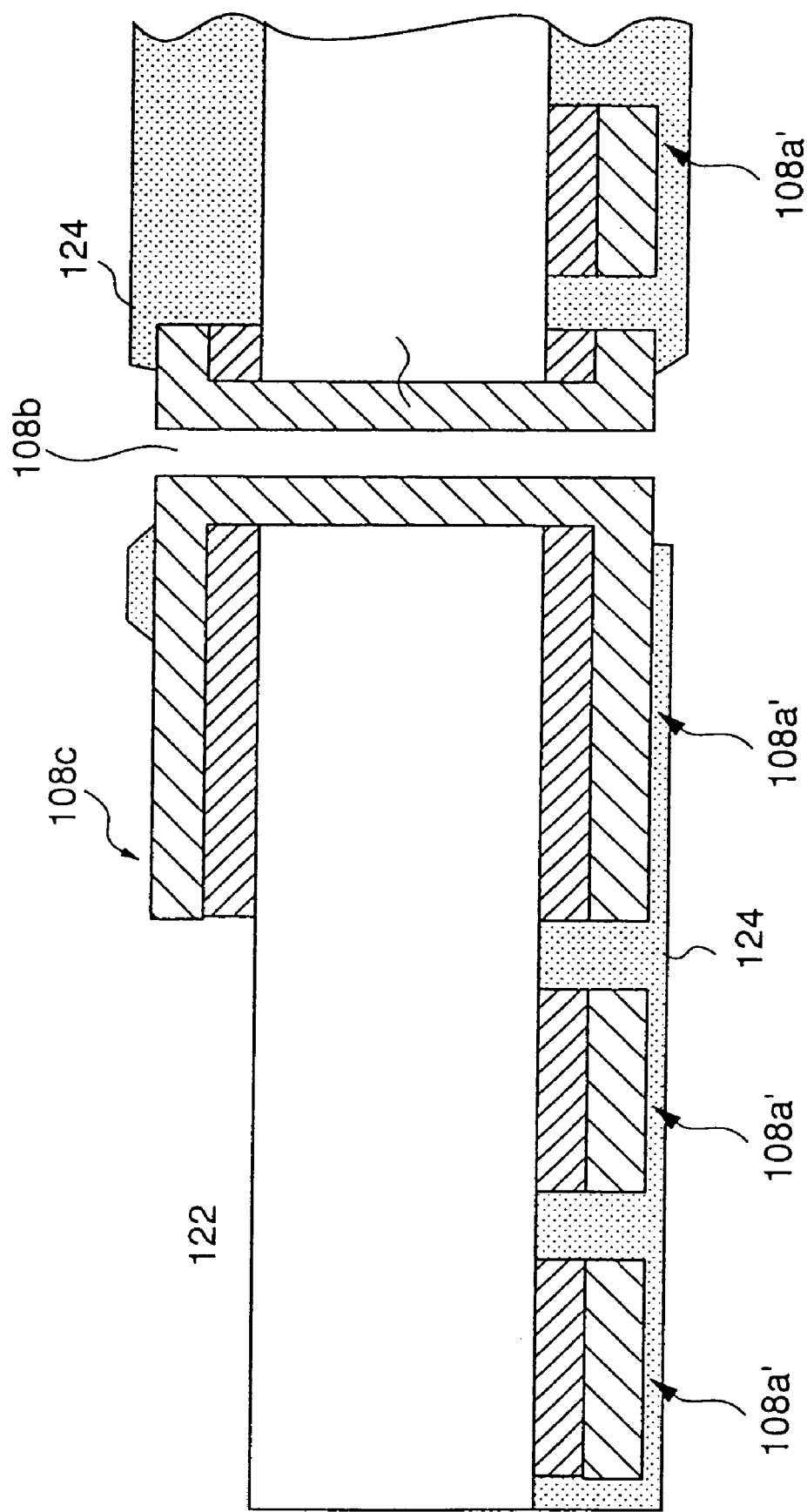

LIQUID CRYSTAL DISPLAY DEVICE HAVING A DRIVE IC MOUNTED ON A FLEXIBLE BOARD DIRECTLY CONNECTED TO A LIQUID CRYSTAL PANEL

This is a Divisional of U.S. patent application Ser. No. 10/100,817, filed on Mar. 29, 2002 now abandoned.

BACKGROUND OF THE INVENTION

1. Field of the Invention

The present invention generally relates to a liquid crystal display device and, more particularly, to a technique to connect a circuit board to a liquid crystal panel of a liquid crystal display device.

2. Description of the Related Art

A conventional liquid crystal display device comprises a liquid crystal panel and a plurality of drive integrated-circuits (drive ICs) for driving the liquid crystal panel. FIG. 1 is a plan view of a conventional liquid crystal display device.

The liquid crystal display device shown in FIG. 1 comprises a liquid crystal panel 2, a plurality of source-side drive ICs 4-1 and a plurality of gate-side drive ICs 4-2. Liquid crystal display signals are supplied from an external circuit (not shown in the figure) to the source-side drive ICs 4-1 and the gate-side drive ICs 4-2 via an input board, circuit boards 8 and 10, a connection board 11 and flexible boards 12 and 14. The liquid crystal display signals are converted into drive signals by the source-side drive ICs 4-1 and the gate-side drive ICs 4-2, and the drive signals are supplied to the liquid crystal panel 2 via the source-side flexible boards 12 and the gate-side flexible boards 14.

Generally, a TCP is used for each of the source-side flexible boards 12 and the gate-side flexible boards 14. FIG. 2 is a plan view of one of the source-side flexible boards 12 and the gate-side flexible boards 14, viewed from a side of a circuit pattern formation surface. FIG. 3 is a cross-sectional view of one of the source-side flexible boards 12 and the gate-side flexible boards 14. As shown in FIG. 3, each of the flexible boards 12 and 14 has a copper foil 20 attached to a base film 16 via an adhesive 18. The copper foil 20 is formed in a predetermined pattern. The base film 16 has an opening 16a at a position to mount the source-side drive IC 4-1 or the gate-side drive IC 4-2. A seal resin 22 is filled in the opening 16a.

As shown in FIG. 2, the flexible boards 12 and 14 are provided with input signal lines 12a and 14a and output signal lines 12b and 14b, respectively. The input signal lines 12a and 14a supply input signals to the drive ICs 4-1 and 4-2, respectively, and the output signal lines 12b and 14b supply output signals of the drive ICs 4-1 and 4-2 to the liquid crystal panel 2.

In the connection method of the signal lines shown in FIG. 1, signal-line connection is required at two positions, one of which is the connection between the liquid crystal panel 2 and each of the flexible boards 12 and 14 and the other is the connection between the flexible boards 12 and 14 and the respective circuit boards 8 and 10. The circuit boards 8 and 10 are provided for merely supplying the input signals to each drive IC. Thus, if the circuit boards 8 and 10 are eliminated from the liquid crystal display device, a manufacturing cost of the circuit boards 8 and 10 is eliminated and also a process for connecting the circuit boards 8 and 10 is eliminated.

Thus, there is suggested a method of eliminating the gate-side circuit board 10 by providing input wiring terminals (or through terminals) on the gate-side drive IC 4-2 as shown in FIG. 4. Specifically, the gate-side drive IC 4-2 shown in FIG. 4 is provided with the input wiring terminals from which the input signals are output without any change. In FIG. 4, terminals A, B, C, D and E are input terminals, and terminals A', B', C' and D' are the input wiring terminals from which the input signals supplied to the input terminals are output without any change. By preparing a drive IC having the above-mentioned structure, the input signals (liquid crystal display signals) can be supplied to each drive IC 4-2 via the flexible board 14 and the liquid crystal panel 2. That is, as shown in FIG. 5, the input signals can be supplied to the gate-side drive ICs 4-2 sequentially one after another by forming input signal lines 2a on the liquid crystal panel 2. Thereby, the gate-side circuit board 10 can be eliminated.

If the source side has a structure that is the same as that of the above-mentioned structure of the gate side, the source-side circuit board 8 can also be eliminated. However, the signal lines of the source side must be smaller than that of the signal lines of the gate side. Generally, when forming the input signal lines 2a on the liquid crystal panel 2, a conductive layer is formed on the liquid crystal panel 2 by a film deposition process or the like, and the conductive pattern is patterned so as to form signal lines. Accordingly, the thickness of the wiring pattern formed on the liquid crystal panel 2 cannot be as large as a thickness of signal lines formed on a flexible board which is formed by patterning a copper foil attached to a flexible base board. Thus, there is a problem in that it is difficult to form a signal line having a low wiring resistance. Accordingly, as shown in FIG. 5, the source-side circuit boards 8 remain unchanged, and only the gate-side circuit boards 10 are eliminated.

Additionally, since a generally used drive IC does not have the input wiring terminals shown in FIG. 4, the drive IC shown in FIG. 4 must be newly designed and manufactured. Thus, the development of such a new drive IC having input wiring terminals requires extensive time and cost.

SUMMARY OF THE INVENTION

It is a general object of the present invention to provide an improved and useful liquid crystal display device in which the above-mentioned problems are eliminated.

A more specific object of the present invention is to provide a liquid crystal display device which doe not use a circuit board to connect a drive IC to a liquid crystal panel without using a specially prepared drive IC.

Another object of the present invention is to provide a liquid crystal display apparatus which can supply input signals to liquid crystal drive ICs without using wiring boards other than flexible boards on which the liquid crystal drive ICs are mounted.

In order to achieve the above-mentioned objects, there is provided according to the present invention a liquid crystal display device which converts input signals into liquid crystal drive signals so as to display an image, the liquid crystal display device comprising: a liquid crystal panel displaying the image thereon; a plurality of flexible boards connected to the liquid crystal panel, each of the flexible boards having a drive IC which converts the input signals into the liquid crystal drive signals; and a connection board connected to the liquid crystal panel so as to supply the input signals to first input lines formed on the liquid crystal panel, wherein each of the flexible boards has second input signal lines for supplying the input signals to the drive IC; a first end of each of the second input signal lines is connected to a respective one of a first group of the first input signal lines; and a second end of each of the second input signal lines is connected to a respective one of a second group of the first input signal lines which are formed in positions different from positions where the first ends of the second input lines are connected to the first group of the first input lines.

According to the present invention, the input signals supplied to the drive IC, which input signals are supplied from the first ends of the second input lines, can be output from the second ends arranged on different positions of the flexible board without using a drive IC having a special terminal arrangement. Thereby, the input signals supplied from the liquid crystal panel to one of the flexible boards can be returned to the liquid crystal panel and subsequently supplied to the adjacent flexible boards one after another. Thus, there is no need to provide a board exclusive for inputting the input signals to each of the flexible boards, which results in reduction in the size of the liquid crystal display device and reduction in the manufacturing cost.

In the liquid crystal display device according to the present invention, the second input lines may be formed so as to cross an area of the flexible board in which the drive IC is mounted, and each of the input terminals of the drive IC may be connected to a respective one of the second input lines within the area where the second input lines cross.

Additionally, each of the flexible boards may have a chip-on-film (COF) structure. The second input signal lines may include at least one input signal line which is not connected to the drive IC. Moreover, the first ends and second ends of the second input signal lines may extend in a direction that is the same as an extension direction of the first input lines. Furthermore, each of the flexible boards may have a first extension part and a second extension part extending in an extension direction of the first input signal lines formed on the liquid crystal panel, and the first ends of the second input signal lines may be formed on the first extension part, and the second ends of the input signal lines are formed on the second extension part. The first input signal lines may include at least one input line having a width different from a width of the first input signal. The first input signal lines may be arranged at different pitches. The second input signal lines may have terminals configured and arranged to be connected to an electronic component part. A plurality of the connection boards are connected to the liquid crystal panel. A part of each of the flexible boards protruding from the liquid crystal panel may be folded. Each of the flexible boards may have the drive IC connected to a gate-side of the liquid crystal panel, and different flexible boards each having a drive IC connected to a source-side of the liquid crystal panel may be connected to the liquid crystal panel via an input signal board on which input signal lines are formed.

Additionally, there is provided according to another aspect of the present invention a liquid crystal display device which converts input signals into liquid crystal drive signals so as to display an image, the liquid crystal display device comprising: a liquid crystal panel displaying the image thereon; a plurality of flexible boards connected to the liquid crystal panel, each of the flexible boards having a drive IC which converts the input signals into the liquid crystal drive signals; and a connection board connected to the liquid crystal panel so as to supply the input signals to first input lines formed on the liquid crystal panel, wherein each of the flexible boards has second input signal lines for supplying the input signals to the drive IC, third input signal lines for supplying the input signals to the drive IC of an adjacent one of the flexible boards and output signal lines for supplying the liquid crystal drive signals from the drive IC to the liquid crystal panel; each of the second input signal lines is connected to a respective one of a first group of the first input lines, and each of the third input signal lines is connected to a respective one of a second group of the first input signal lines formed in positions different from positions where the first group of the first input signal lines are formed; and at least a part of the second and third input signal lines extends in a direction substantially perpendicular to an extension direction of the output signal lines in a portion connected to the liquid crystal panel.

According to the above-mentioned invention, in a part of the second and third input lines, which extends in the direction perpendicular to the extension direction of the output signal lines in the connection part with the liquid crystal panel, the first input signals formed on the liquid crystal panel can be substantially doubled so as to reduce the wiring resistance of the input signal lines.

Further, there is provided according to another aspect of the present invention a flexible board on which a drive IC for driving a liquid crystal panel is mounted, the flexible board comprising a plurality of input signal lines which extend to cross an area where the drive IC is mounted, each of the input signal lines having a first end and a second end being located at different positions on the flexible board.

According to the flexible board of the present invention, the input signals supplied to the flexible board can be output from the flexible board without any change. Thereby, the input signals can be transferred an adjacent flexible board, which enables sequential supply of the input signals from a single input signal to a plurality of flexible boards sequentially one after another.

In the flexible board according to the present invention, the drive IC may have input terminals connected to a portion of the input signal lines within the area where the drive IC is mounted.

Additionally, there is provided according to another aspect of the present invention, a liquid crystal display device which converts input signals into liquid crystal drive signals so as to display an image, the liquid crystal display device comprising: a liquid crystal panel displaying the image thereon; a plurality of flexible boards connected to the liquid crystal panel, each of the flexible boards having a drive IC which converts the input signals supplied to input terminals thereof into the liquid crystal drive signals, the drive IC having relay terminals outputting the input signals supplied to the input terminals without any change; a wiring board connected to the flexible boards so as to supply the input signals to each of the flexible boards; and a connection board connected to the wiring board so as to supply the input signals to first input lines formed on the wiring board, wherein each of the flexible boards has second input signal lines connected to the input terminals of the drive IC for supplying the input signals to the drive IC and third input signal lines connected to the relay terminals for supplying the input signals to an adjacent one of the flexible boards; and the third input signal lines provided to one of adjacent flexible boards are connected to the second input signal lines provided to the other of the adjacent flexible boards via the first input signal lines provided to the wiring board.

According to the above-mentioned invention, the flexible boards can be serially connected by the first input signals provided to the wiring board, thereby enabling use of an inexpensive single layer board as the wiring board.

In the liquid crystal display device according to the above-mentioned invention, the second and third input signal lines of a part of the plurality of flexible boards may be connected to the input signal lines formed on the liquid crystal panel, and the wiring board has first relay input signal lines for supplying the input signals to the input signal lines formed on the liquid crystal panel. At least one of the flexible boards may have second relay input signal lines which connect between the input signal lines formed on the liquid crystal panel and the first relay input signal lines formed on the wiring board. Each of the flexible boards may have output signal lines connected to the liquid crystal panel, and at least a part of the second and third input signal lines connected to the input signal lines formed on the liquid crystal panel may have a pitch greater than a pitch of the output signal lines. At least a part of the second and third input signal lines connected to the input lines formed on the liquid crystal panel may have a part extending in an extension direction of the input signal lines formed on the liquid crystal panel. The first input signal lines formed on the wiring board may include at least one common line formed on a surface of the wiring board different from a surface on which the first input signal lines are formed. At least a part of the second and third input signal lines may extend in an extension direction of the first input signal lines formed on the wiring board in a portion connected to the wiring board. A width and a pitch of the second and third input signal lines extending in the extension direction of the first input signal lines formed on the wiring board may be greater than a width and a pitch of the reset of the second and third input signal lines in a portion connected to the wiring board.

Additionally, there is provided according to another aspect of the present invention a liquid crystal display apparatus comprising: a glass substrate having a liquid display part formed thereon; a plurality of flexible boards connected to a periphery of the glass substrate, a liquid crystal drive IC being mounted on each of the flexible board so as to generate liquid crystal drive signals based on input signals, wherein the glass substrate has first internal lines and second internal lines, the first internal lines for supplying the input signals supplied from a first one of the flexible boards to a second one of the flexible boards, the second internal lines for returning the input signals supplied from the first one of the flexible boards to the first one of the flexible boards without any change.

According to the above-mentioned invention, the input signals can be sequentially supplied to a plurality of flexible boards via the internal lines formed on the glass substrate, and, thereby there is no need to provide a board for supplying input signals separately. Thus, the input signals can be supplied to the liquid crystal drive IC without using boards other than the flexible boards on which the liquid crystal drive ICs are mounted, which reduces a number of manufacturing processes and the manufacturing cost of the liquid crystal display device.

In the liquid crystal display apparatus according to the above-mentioned invention, one of the flexible boards may have through lines for supplying the input signals supplied from an external circuit to the glass substrate without any change. Each of the flexible boards may have through lines for returning the input signals supplied from the glass substrate to the glass substrate without any change.

Additionally, there is provided according to another aspect of the present invention a flexible board configured and arranged to be connected to a glass substrate having a liquid crystal display part formed thereon, and having a liquid crystal drive IC mounted thereon for generating liquid crystal drive signals based on input signals, the flexible board comprising through lines for supplying the input signals supplied from an external circuit to the glass substrate without any change.

Accordingly, the input signals can be arbitrarily introduced into any one of the flexible boards by the through lines of the flexible boards and the internal lines of the glass substrate so as to supply first the input signals to the selected one of the flexible boards, which improves a freedom of design of the input signal supply path.

Other objects, features and advantages of the present invention will become more apparent from the following detailed description when read in conjunction with the accompanying drawings.

BRIEF DESCRIPTION OF THE DRAWINGS

FIG. 21 is a plan view of a flexible board provided to a liquid crystal display device according to a third embodiment of the present invention;

FIG. 25 is a plan view of a liquid crystal display device having wiring boards;

FIG. 31A is a plan view of a front surface of the source-side wiring board;

FIG. 31B is a plan view of a back surface of the source-side wiring board;

FIG. 32 is a cross-sectional view taken along a double-dashed chain line I-I of FIG. 31A;

DETAILED DESCRIPTION OF THE PREFERRED EMBODIMENTS

Figure 6:
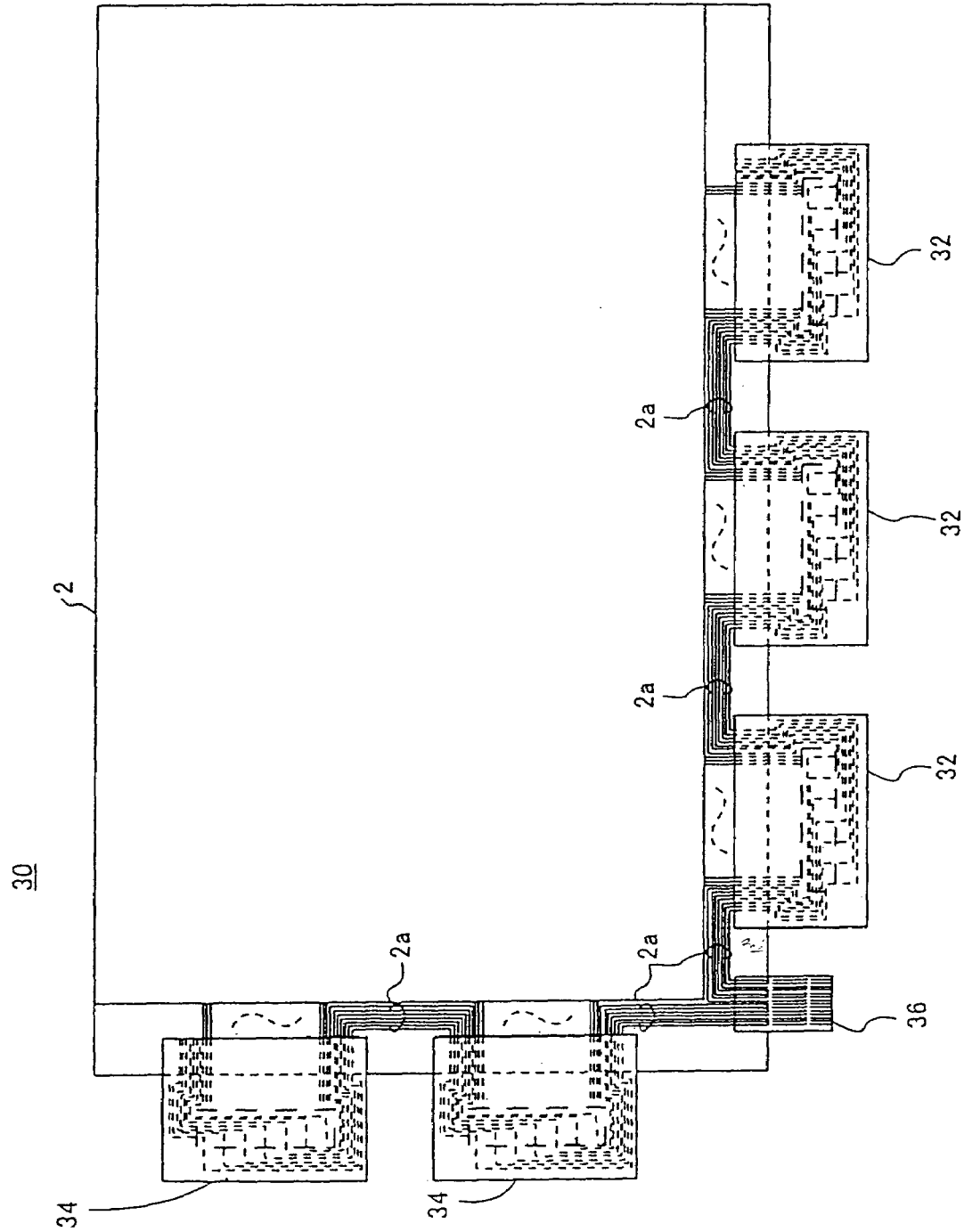
FIG. 6 is a plan view of a liquid crystal display device according to a first embodiment of the present invention.

A description will now be given, with reference to FIG. 6, of a first embodiment of the present invention. FIG. 6 is a plan view of a liquid crystal display device according to the first embodiment of the present invention. In FIG. 6, parts that are the same as the parts shown in FIG. 1 are given the same reference numerals, and descriptions thereof will be omitted.

A liquid crystal display device 30 according to the first embodiment of the present invention consists of a liquid crystal panel 2, source-side and gate-side flexible boards 32 and 34 on which source-side and gate-side drive ICs 4-1 and 4-2 are mounted, respectively, and a connection board 36. The source-side and gate-side flexible boards 32 and 34 are directly connected to the liquid crystal panel 2. That is, the liquid crystal display device 30 according to the present embodiment does not have the circuit boards 8 and 10 shown in FIG. 1.

Figure 1:
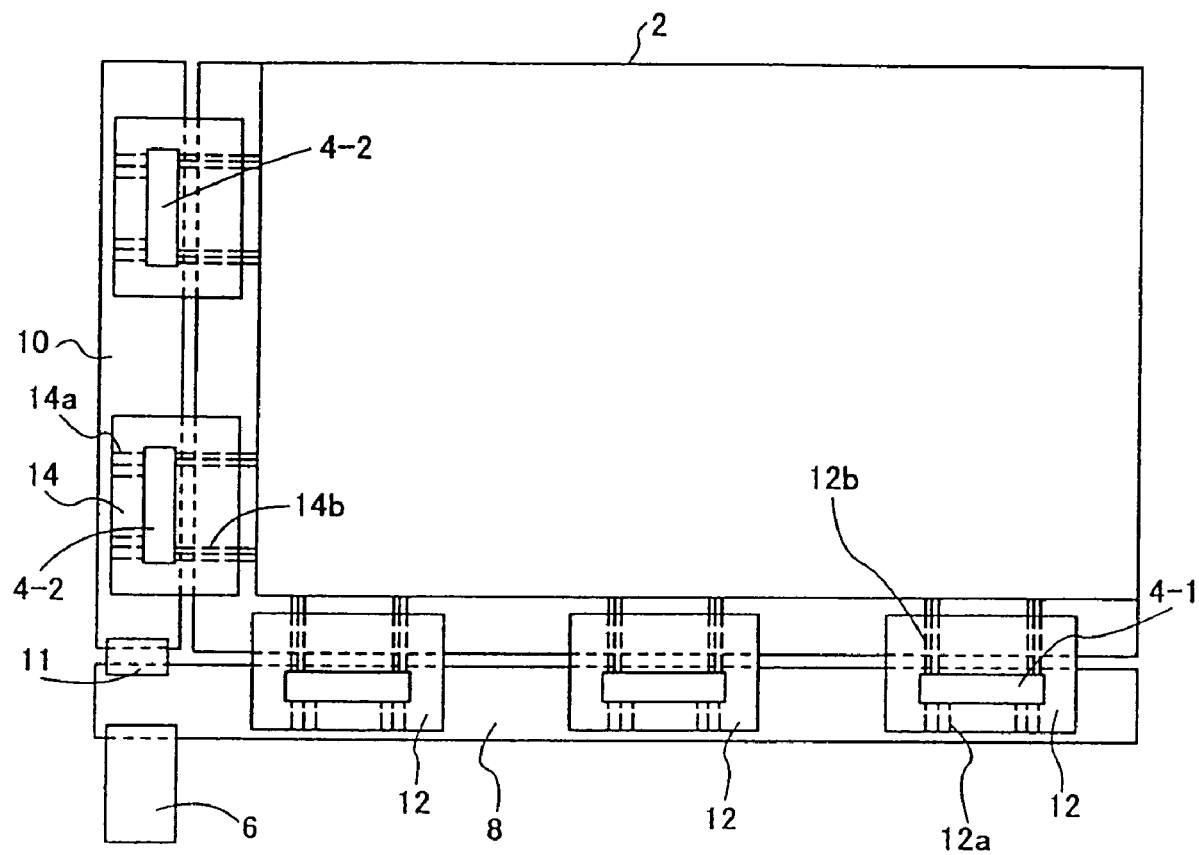
FIG. 1 is a plan view of a conventional liquid crystal display device.
Figure 2:
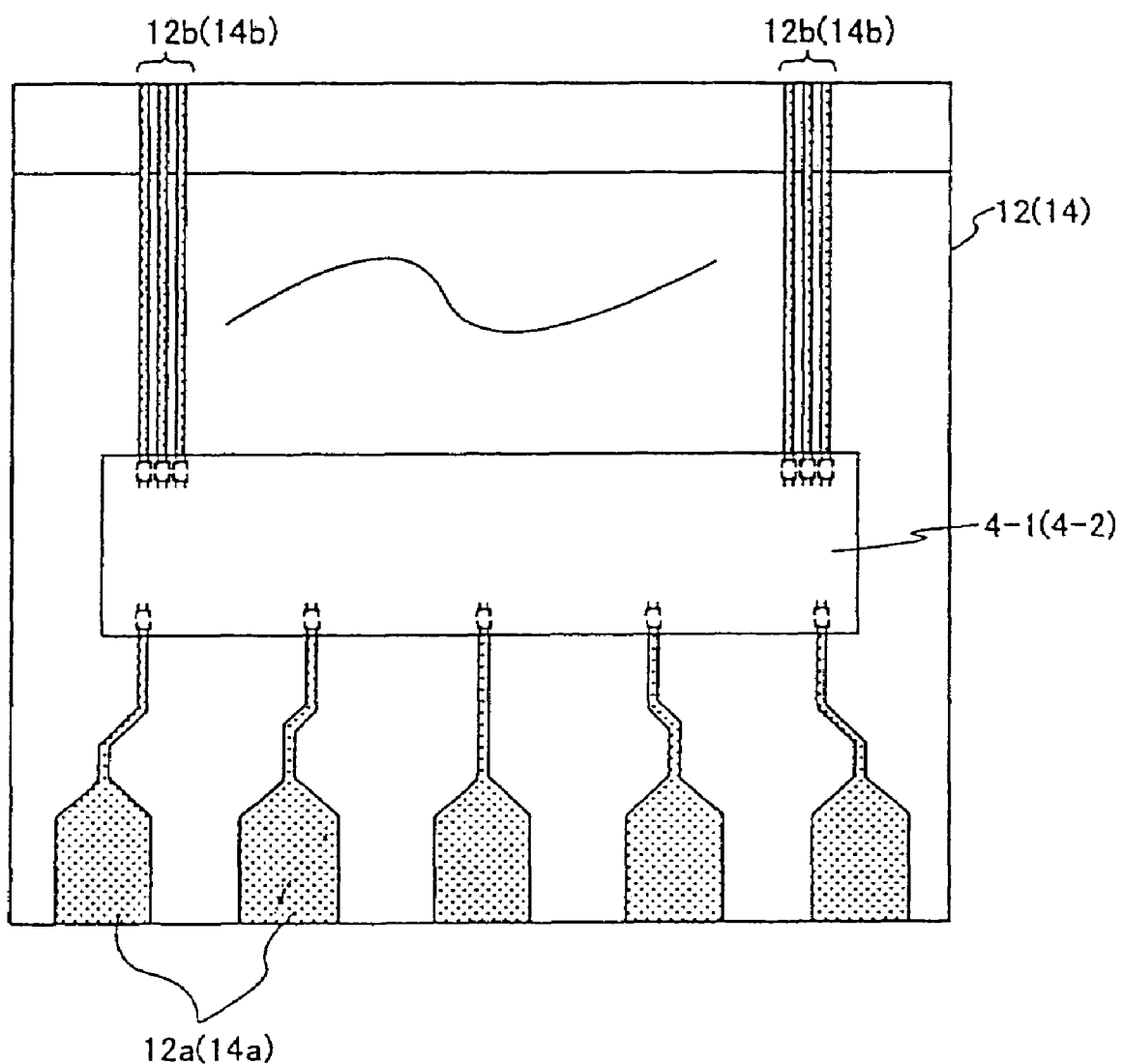
FIG. 2 is a plan view of a source-side flexible boards or a gate-side flexible board as shown in FIG. 1, viewed from a side of a circuit pattern formation surface.
Figure 7:
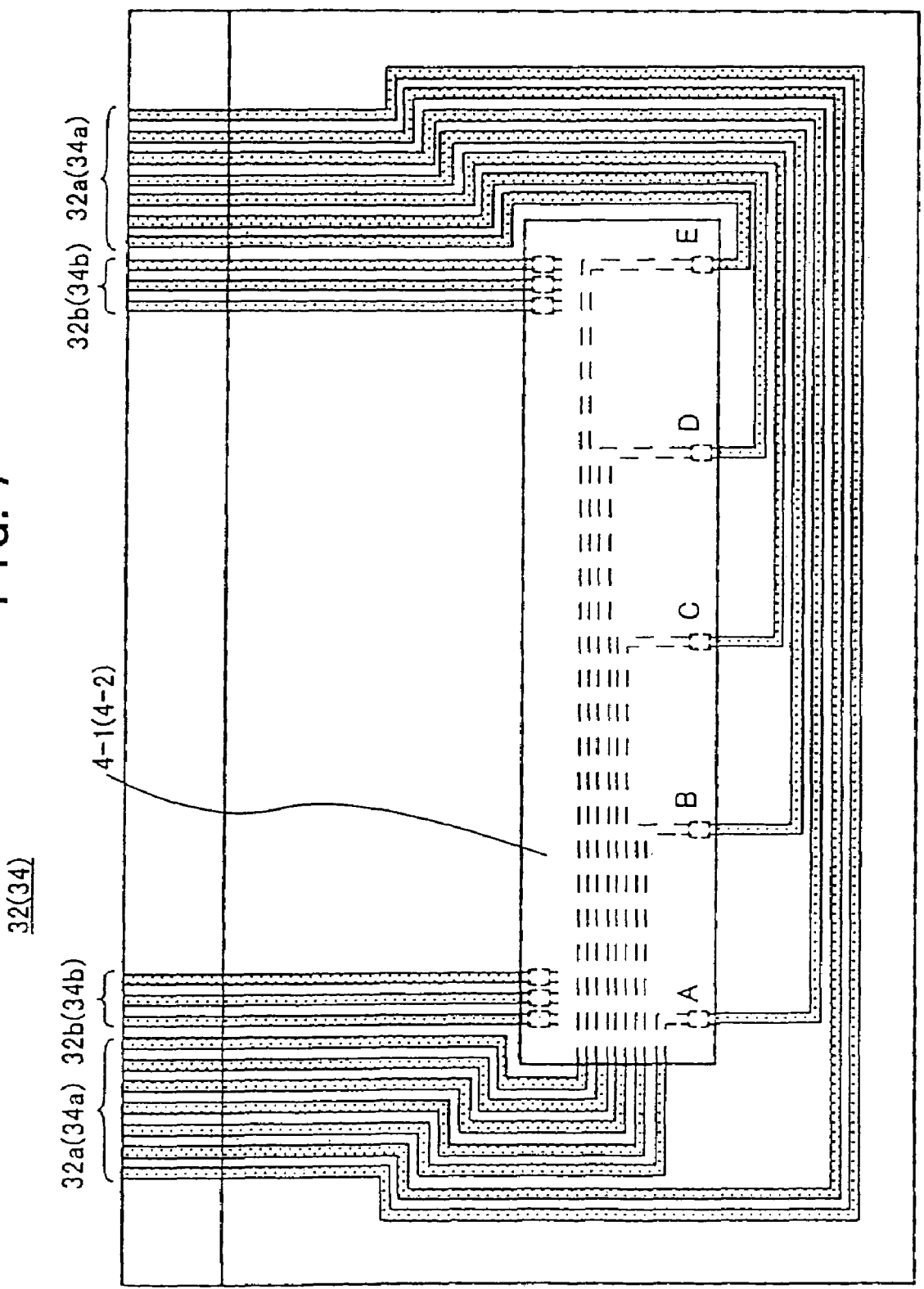
FIG. 7 is a plan view of a flexible board as shown in FIG. 6.
Figure 8:
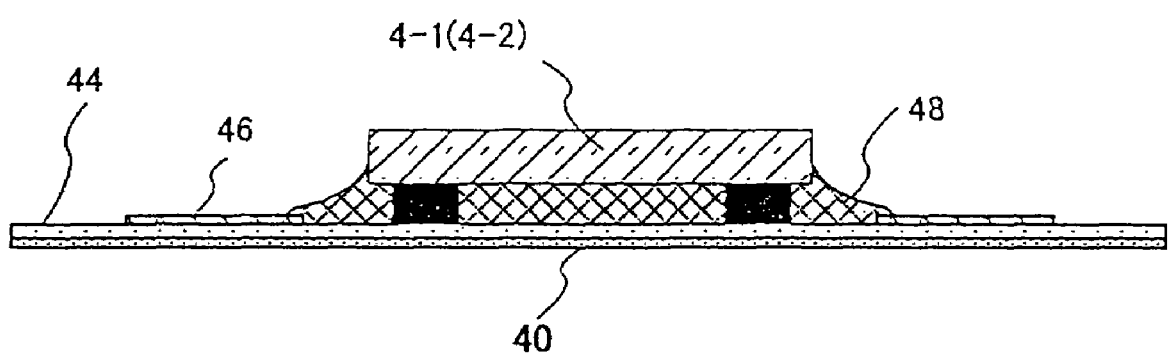
FIG. 8 is a cross-sectional view of the flexible board.

Therefore, the input signal lines formed on the circuit boards 8 and 10 shown in FIG. 1 are distributed to and formed on the flexible boards 32 and 34 and the liquid crystal panel 2. Here, a description will be given, with reference to FIGS. 7 and 8, of input signal lines 32a and 34a formed on the flexible boards 32 and 34. FIG. 7 is a plan view of the flexible boards 32 and 34. FIG. 8 is a cross-sectional view of the flexible boards 32 and 34.

The drive ICs 4-1 and 4-2 are mounted on the respective flexible boards 32 and 34. The input signal lines 32a and 34a are connected to input terminals A-E of the drive ICs 4-1 and 4-2. Liquid crystal display signals (input signals) are supplied to the drive ICs 4-1 and 4-2 through the input signal lines 32a and 34a. Output signal lines 32b and 34b are connected to output terminals of the drive ICs 4-1 and 4-2. Drive signals of the liquid crystal panel 2 converted by the drive ICs 4-1 and 4-2 are supplied to the liquid crystal panel 2 through the output signal lines 32b and 34b.

It should be noted that the plan view of FIG. 7 is a view of the flexible board shown in FIG. 6 viewed from the reverse side. That is, in FIG. 6, the drive ICs 4-1 and 4-2, the input signal lines 32a and 34a and the output signal lines 32b and 34b are provided on the reverse side of the flexible boards 32 and 34.

After the input signal lines are connected to the input terminals of the drive ICs 4-1 and 4-2, the input signal lines 32a and 34a pass through under the drive ICs 4-1 and 4-2 and extend to the end of the flexible boards 32 and 34. Therefore, the opposite ends of each of the input signal lines 32a and 34a are located on the end of the flexible boards, and the drive ICs 4-1 and 4-2 are connected in the middle of the input signal lines 32a and 34a.

The above-mentioned composition of the flexible boards 32a and 34a is attained by making the flexible boards 32a and 34a into a COF (chip-on film) structure, as shown in FIG. 8. That is, in the present embodiment, the input signal lines 32a and 34a are formed also in positions where the drive ICs 4-1 and 4-2 are mounted by adopting a COF structure for the flexible boards 32 and 34.

That is, as shown in FIG. 8, each of the flexible boards 32 and 34 comprises a base film 40 and a copper foil 44. The input signal lines 32a and 34a and the output signal line 32b and 34b are formed by patternizing the copper foil 44. As mentioned above, the input signal lines are formed also in areas (parts indicated by dotted lines in FIG. 7) where the drive ICs 4-1 and 4-2 are mounted. It should be noted that, in FIG. 8, a solder resist 46 is applied to the patternized copper foil 44, and a resin 48 is filled between each of the drive ICs 4-1 and 4-2 and the base film 40 (the copper foil 44 patternized as signal lines). The drive ICs 4-1 and 4-2 are mounted by ACF or ACP, or metal-bonding such as Au—Sn or Au—Au.

With the conventional TCP structure, an opening is provided under a drive IC, and, thus, a signal line cannot be formed under the drive IC. However, in the present embodiment, the input signal lines 32a and 34a can be formed also in the positions where the drive ICs 4-1 and 4-2 are mounted by adopting a COF structure for the flexible boards. Thereby, the input signals supplied from the liquid crystal panel 2 can be returned to the liquid crystal panel 2 through the flexible boards 32 and 34. That is, an end and an opposite end of each of the input signal lines can be arranged at different positions of the flexible board without the input lines overlapping with each other by laying the input signal lines under the drive IC. Thereby, the input signals can be supplied (returned) to the liquid crystal panel 2 from flexible boards 32 and 34 while supplying the same input signals to the drive ICs 4-1 and 4-2 mounted on the flexible boards 32 and 34.

A description will now be given, with reference to FIG. 6, of an input path of the liquid crystal display signal as an input signal. The liquid crystal display signals (input signals) supplied from an external device is supplied to the liquid crystal panel 2 through the connection board 36. Giving a description of a source side, the input signal supplied through the connection board 36 is supplied to the flexible board 32 closest to the connection board 36 through the input signal lines 2a formed on the liquid crystal panel 2. Then, the input signals are supplied to the drive IC 4-1 through the input signal lines 32a. The input signals are converted into the drive signals for driving the liquid crystal panel 2 by the drive IC 4-1, and are output to the output signal lines 32b.

On the other hand, the input signal lines 32a connected to the drive IC 4-1 are further extended from the location connected to the input terminals of the drive IC 4-1 and reach the end of the flexible board 32. Thereby, the input signals supplied to one of the ends of the input signal lines 32a of the flexible board 32 are output from the other ends of the input signal lines 32a while being supplied to the drive IC 4-1.

The other ends of the input signal lines 32a are connected to the respective input signal lines 2a formed on the liquid crystal panel 2, and are connected to the adjacent flexible board 32 through the input signal lines 2a. Therefore, the input signals supplied from the connection board 36 supplied also to the adjacent flexible board 32 through the input signal lines 2a formed on the liquid crystal panel 2a and the input signal lines 32a formed on the flexible board 32. It should be noted that although FIG. 6 shows the input signal line 2a formed on the liquid crystal panel 2, it is preferable to cover the input signal lines 2a by an insulating film except for a connection part.

The input signals supplied to the flexible board 32 are further supplied to the subsequent flexible boards 32 sequentially one after another according to the above-mentioned structure of the input signal lines. It should be noted that input signals for the gate side are sequentially supplied to the gate-side flexible boards 34 one after another according to the same input line structure.

Thus, in the liquid crystal display device 30 according to the present embodiment, since the circuit board for input signals, which has been used conventionally, can be eliminated, a manufacturing cost of the circuit board can be eliminated. Moreover, since the connection process of the circuit board can also be eliminated, the number of processes can be decreased and the manufacture cost of the liquid crystal display device 30 can be cut down further.

Figure 9:
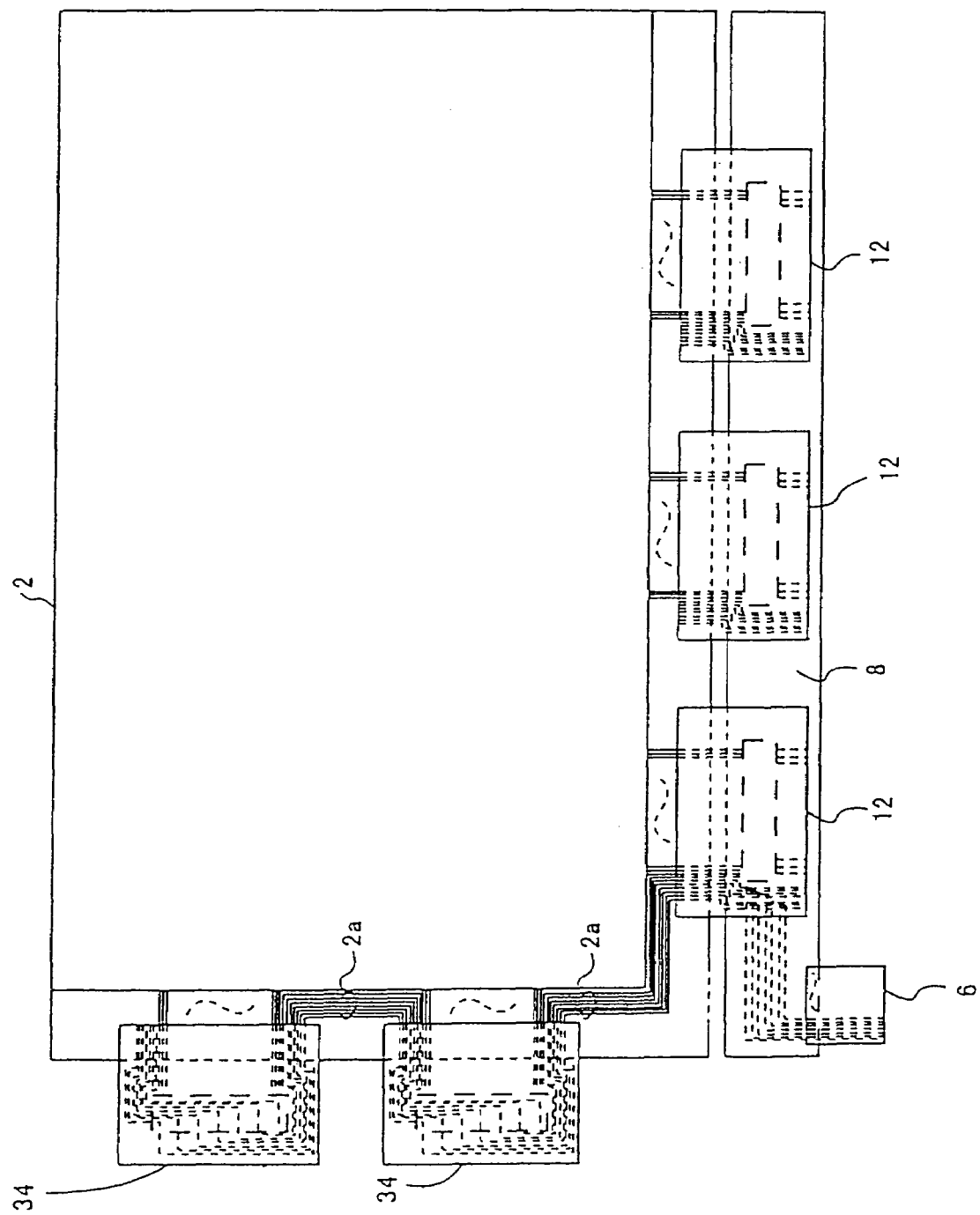
FIG. 9 is a plan view of a liquid crystal display device in which gate-side circuit boards are eliminated.

In addition, although the circuit board is eliminated on both the source side and the gate side in the liquid crystal display device 30 shown in FIG. 6, when a wiring resistance on the source side cannot be made into a suitable low value, the circuit board may be eliminated only on the gate side and the circuit board 8 may be provided on the gate side as shown in FIG. 9 similar to the conventional device.

Figure 10:
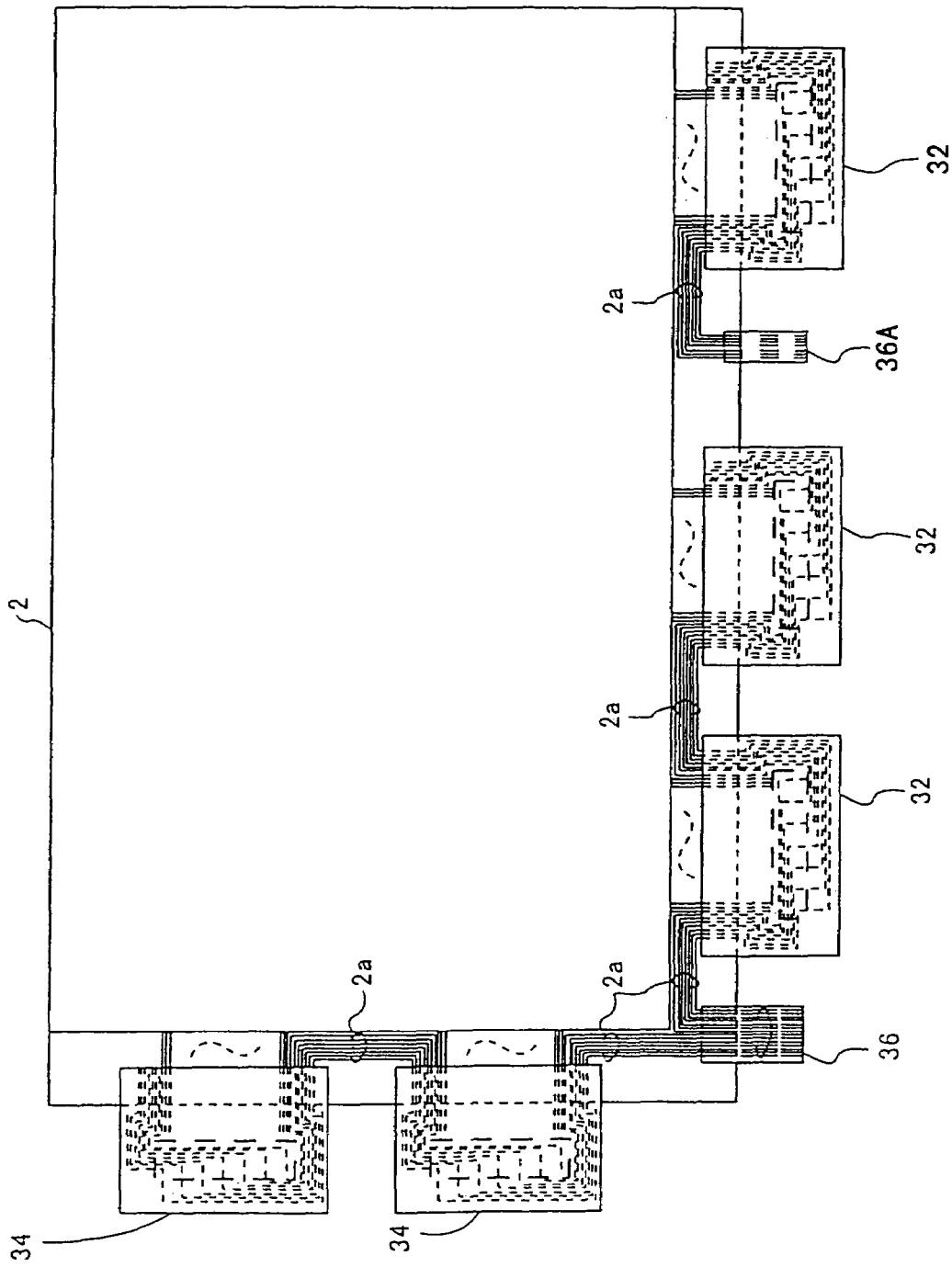
FIG. 10 is a plan view of a liquid crystal display device in which a different connection board is provided to a flexible board remote from a connection board.

Moreover, as shown in FIG. 10, a connection board 35A separate from the connection board 36 may be provided to the flexible board 32 remote from the connection board 36. Thereby, the input signals can be positively supplied to the flexible board 32 remote from the connection board 36.

Figure 11:
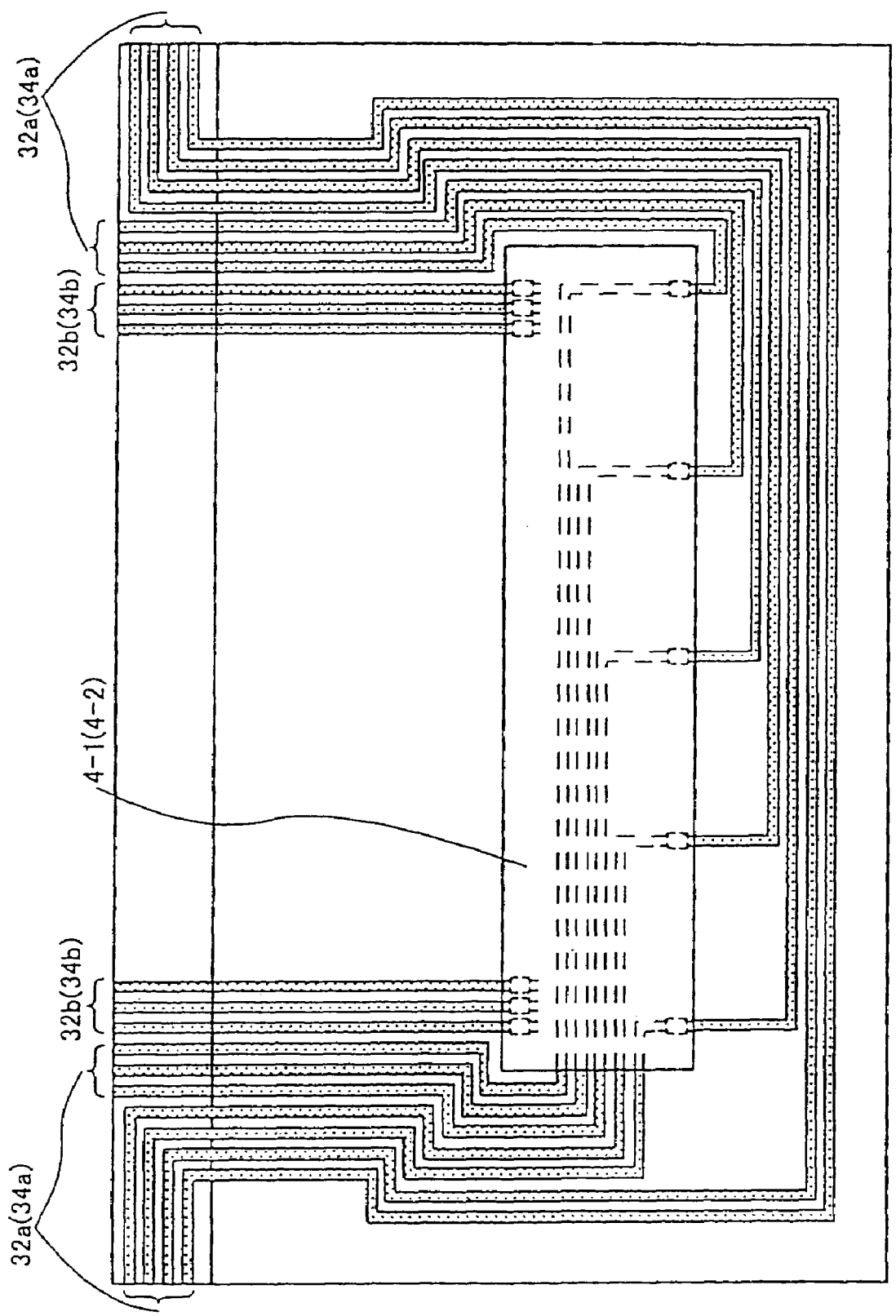
FIG. 11 is a plan view of a variation of the flexible board shown in FIG. 7.

Moreover, as shown in FIG. 11, the input signal lines 32a and 34a formed on flexible boards 32 and 34 may be extended along a longitudinal direction of portions of the flexible boards 32 and 34 connected to the liquid crystal panel 2. Thereby, there is no need to bend the ends of the input signal lines 2a formed on the liquid crystal panel 2 as shown in FIG. 6, which results in a reduction in the length of the input signal lines 2a formed on the liquid crystal panel 2.

Figure 12:
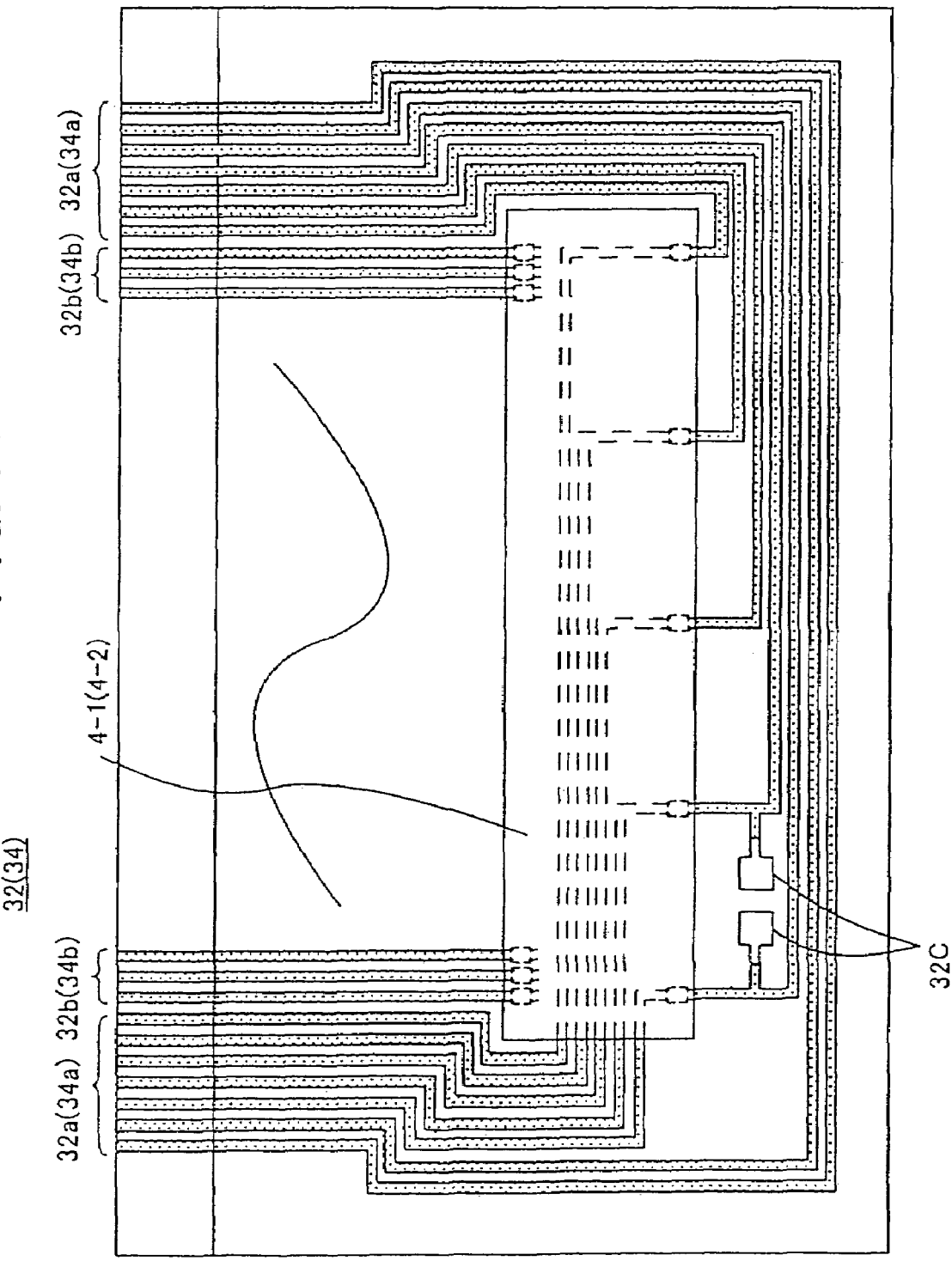
FIG. 12 is another variation of the flexible board shown in FIG. 7.

Moreover, as shown in FIG. 12, terminals 32c for connecting electric circuit components such as a coupling capacitor may be formed between the input signal lines 32a and 34a formed on flexible boards 32 and 34.

Figure 13:
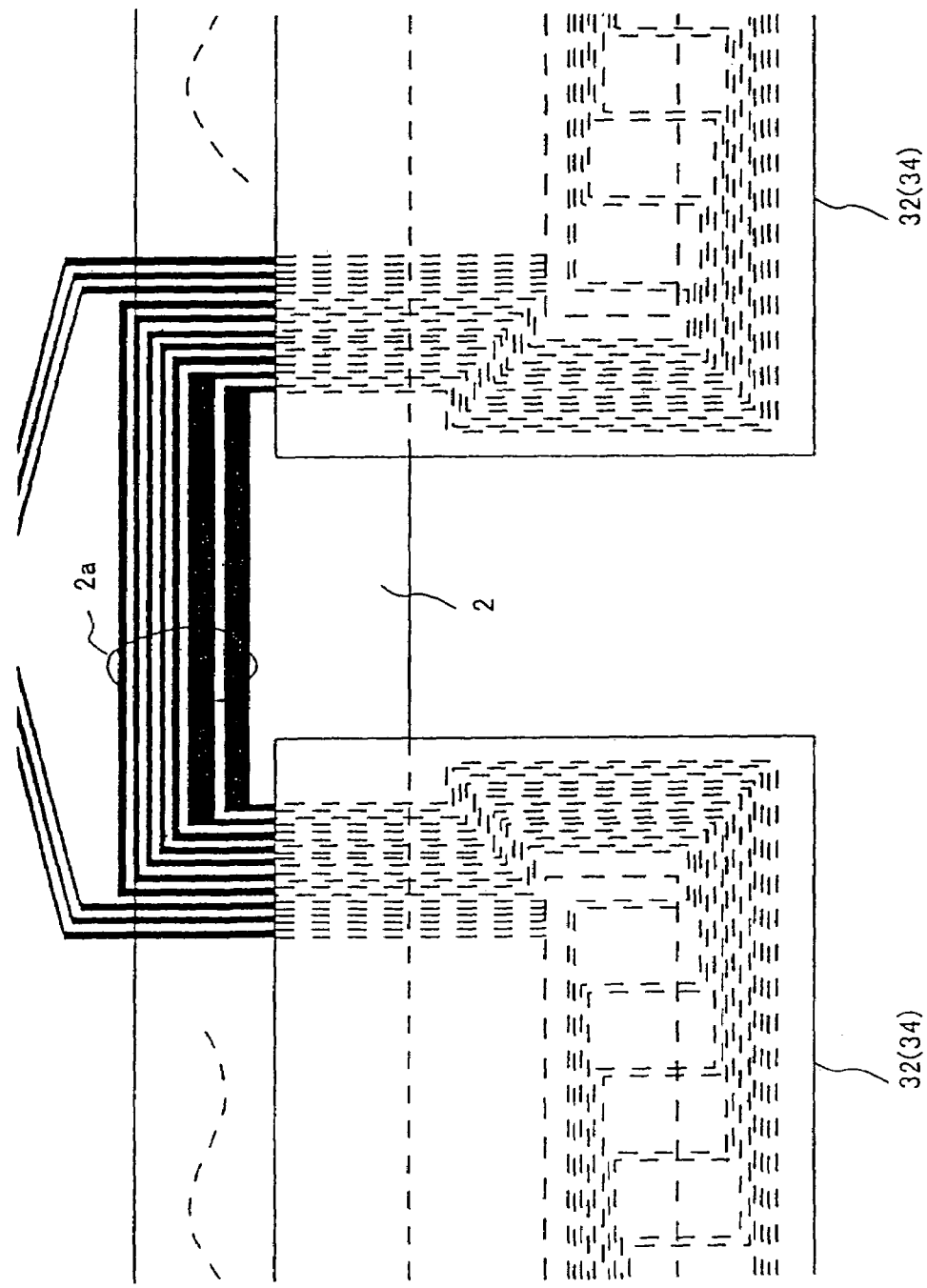
FIG. 13 is a plan view of a part of a variation of the liquid crystal panel shown in FIG. 6.

Further, as shown in FIG. 13, a pitch and a width of a part of the input signal lines may be varied among the input signal lines 2a formed on the liquid crystal panel 2. Thereby, in a case in which there is a specific line of which wiring resistance must be set smaller among the input signal lines, the width of the specific line can be increased so as to reduce the wiring resistance.

A resistance value R of a line formed on the liquid crystal panel 2 can be calculated by the following formulas, where ρ represents a volume specific resistance of line, l represents a length of the line, w represents a width of the line and t represents a thickness of a film forming the line.

$$R = \rho l / wt \quad (1)$$

In the formula (1), the volume specific resistance ρ and the thickness t of the film forming the line can be regarded as constants, and, thus, the formula (1) can be changed to the following formula on the assumption that ρ/t=A (constant) is established.

$$R = Al/w \quad (2)$$

Therefore, the resistance value of each line can be made equal by adjusting the length and width of the line based on the above-mentioned formula (2).

Figure 14:
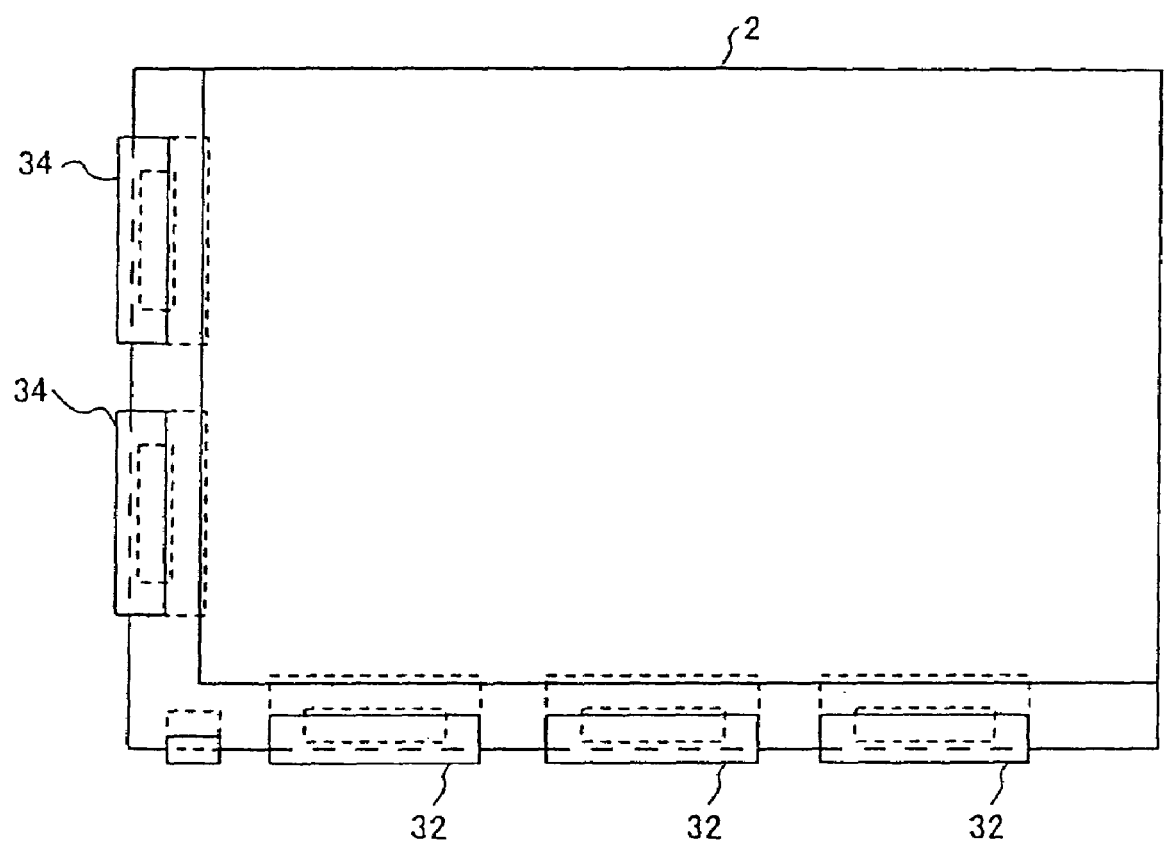
FIG. 14 is a plan view of a liquid crystal display device in which a connection board and flexible boards are folded.

Moreover, as shown in FIG. 14, the size of the liquid crystal display device itself can be made small by bending the connection board 36 and the flexible boards 32 and 34. That is, the size of the whole liquid crystal display device can be made almost equal to the size of the liquid crystal panel 2 by folding parts of the flexible boards 32 and 34 other than the parts overlapped and connected with the liquid crystal panel 2 (parts protruding from the liquid crystal panel 2 in the connected state) to the reverse side of the liquid crystal panel 2. In FIG. 14, the parts of the connection bard 36 and the flexible boards 32 and 34, which parts protrude from the liquid crystal panel 2, are folded from the reverse side to the front side of the drawing sheet.

Figure 15:
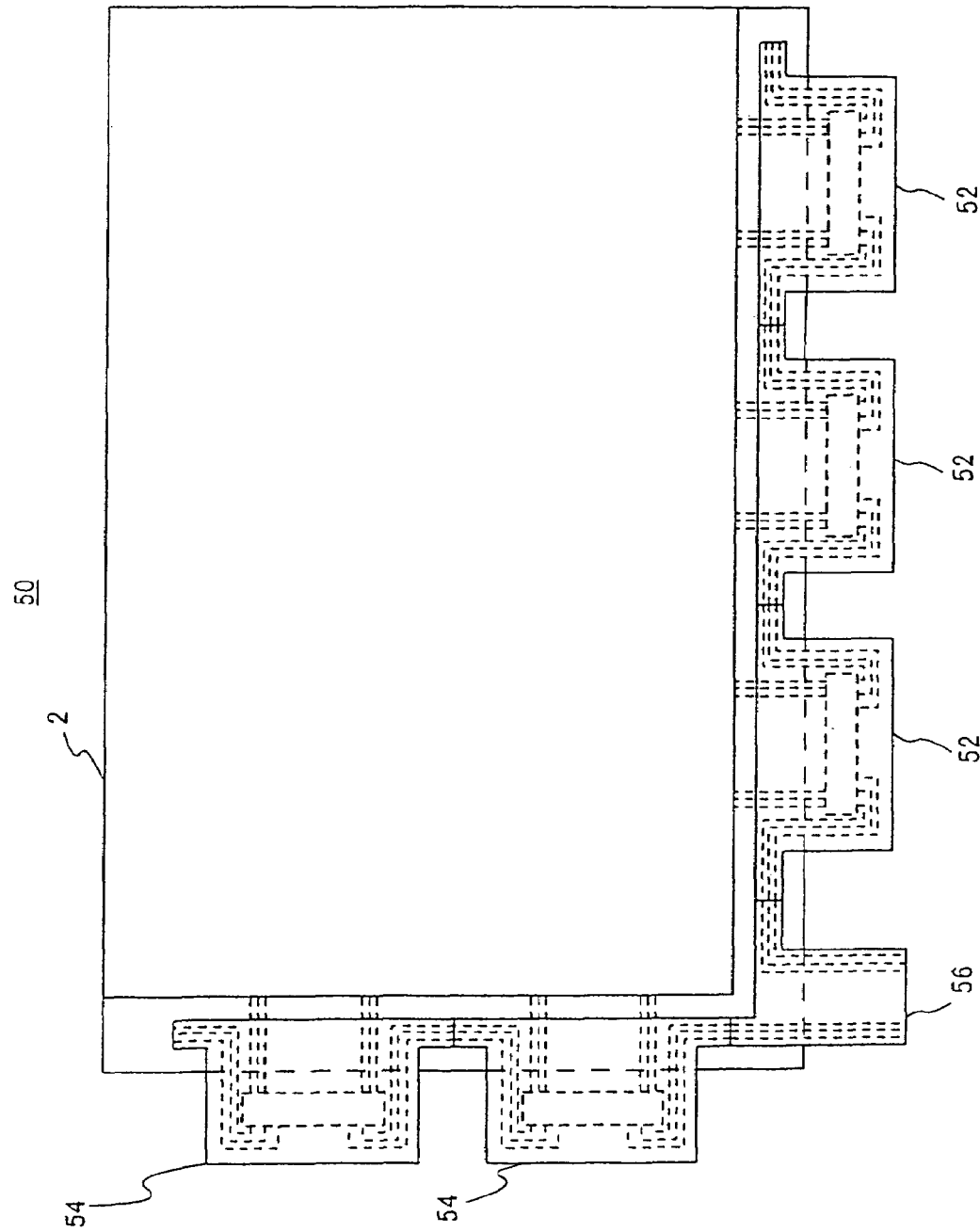
FIG. 15 is a plan view of a liquid crystal display device according to a second embodiment of the present invention.

A description will now be given, with reference to FIGS. 15 and 16, of a second embodiment of the present invention. FIG. 15 is a plan view showing an outline composition of a liquid crystal display device 50 according to the second embodiment of the present invention. The liquid crystal display device 50 according to the second embodiment of the present invention has a basic structure the same as the liquid crystal display device 30 shown in FIG. 6 except for the input signal lines formed on the flexible boards are overlapped with the input signal lines formed on the liquid crystal panel 2 so as to maintain a small wiring resistance of the input signal lines.

As shown in FIG. 15, the liquid crystal display device 50 comprises the liquid crystal panel 2, source-side and gate-side flexible boards 52 and 54 and a connection board 56. Drive ICs 60-1 and 60-2 having the terminals outputting input signals without any change to the input signals are mounted on the respective flexible boards 52 and 54, and the input signals are supplied to the subsequent flexible boards 52 and 54 sequentially one after another through the adjacent flexible boards 52 and 54. It should be noted that although in the present embodiment the drive IC 60-1 and 60-2 having the terminals which output input signals are used, the input signal lines may be provided in areas under the drive ICs 60-1 and 60-2 in the same manner as in the liquid crystal display device 30 according to the above-mentioned first embodiment. That is, the drive ICs 4-1 and 4-2 can be used for the flexible boards 52 and 54 provided in the liquid crystal display device 30.

Figure 16:
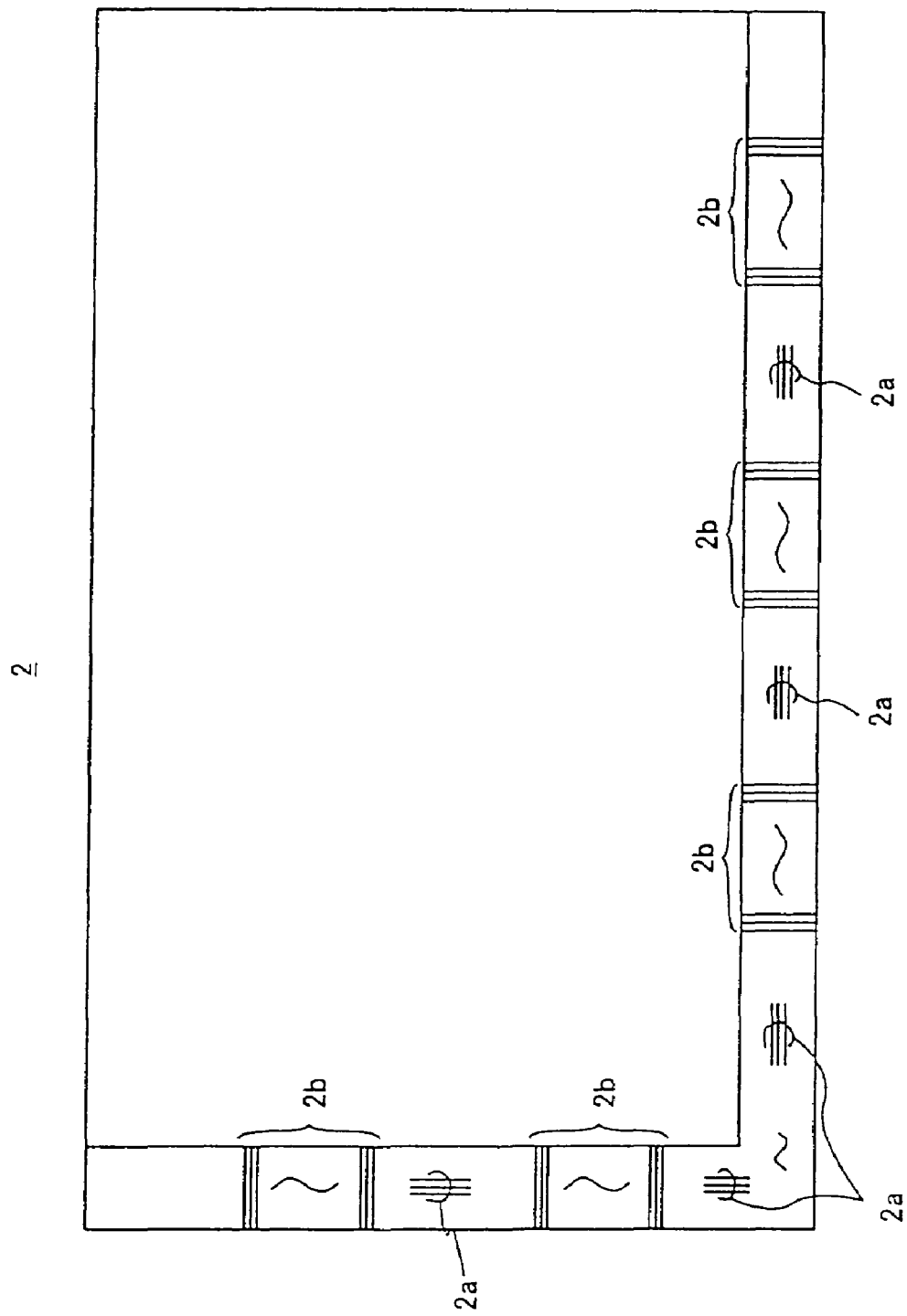
FIG. 16 is a plan view of a liquid crystal panel as shown in FIG. 15.

FIG. 16 is a plan view of the liquid crystal panel shown in FIG. 15. The input signal lines 2a and the output signal lines 2b are formed on the liquid crystal panel 2. The input signal lines 2a are provided for transmitting the input signals between the connection board 56 and each of the flexible boards 52 and 54 and between the adjacent flexible boards 52 and 54. Moreover, the output signal lines 2b are provided for transmitting the drive signals of the liquid crystal panel 2 output from the flexible boards 52 and 54. The output signal lines 2b are formed only in the parts located between the connection board 56 and each of the flexible boards 52 and 54 and between the adjacent flexible boards 52 and 54 as shown in FIG. 16.

Figure 17:
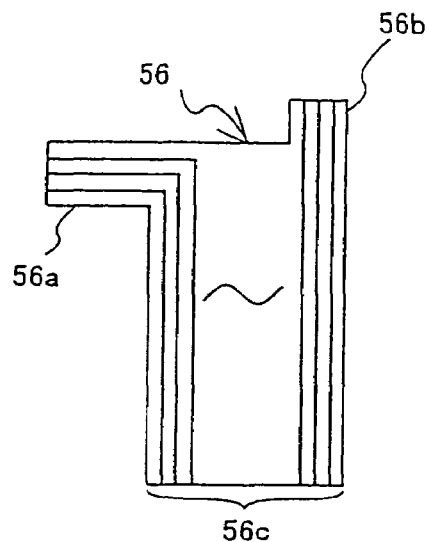
FIG. 17 is a plan view of a connection board show in FIG. 15.

FIG. 17 is a plan view of the connection board 56. The connection board 56 is connected to the liquid crystal panel 2 so as to supply the input signals. Here, although the connection board 36 shown in FIG. 6 has a rectangle shape, the connection board 56 according to the present embodiment has extending sections 56a and 56b, which extend from the rectangle. As shown in FIG. 15, the extension section 56a is extended toward the adjacent source-side flexible board 52. The extension section 56b is extended toward the adjacent gate-side flexible board 54.

Input signal lines 56c are formed on the extension sections 56a and 56b. In a state in which the connection board 56 is connected to the liquid crystal panel 2, the input signal lines 56c formed on the extension sections 56a and 56b are arranged so as to accurately overlap with the input signal lines 2a formed on the liquid crystal panel 2.

That is, the input signal lines 2a formed on the liquid crystal panel 2 and the input signal lines 56c formed on the extension sections 56a and 56b of the connection board 56 together constitute the entire input signal lines. Thereby, even if the wiring resistance is too high only by the input signal lines 2a formed on the liquid crystal panel 2, the wiring resistance can be reduced by overlapping the input signal lines 56c formed on the extension sections 56a and 56b of the connection board 56. It should be noted that a relatively flexible substrate material such as polyimide is used for the connection board 56 so that the connection board can be easily folded.

Figure 3:
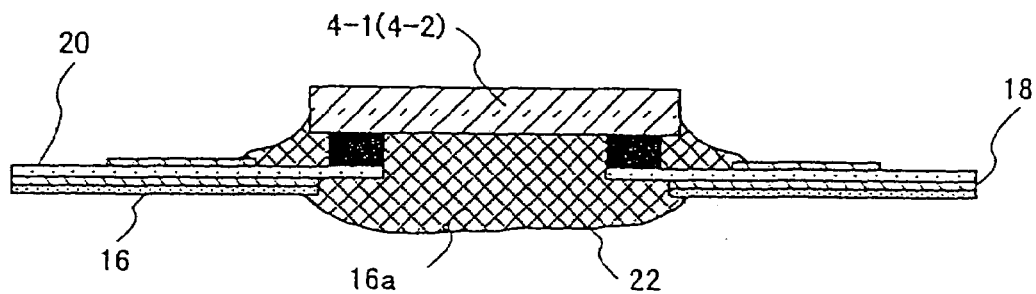
FIG. 3 is a cross-sectional view of the source-side flexible board or the gate-side flexible board.
Figure 18:
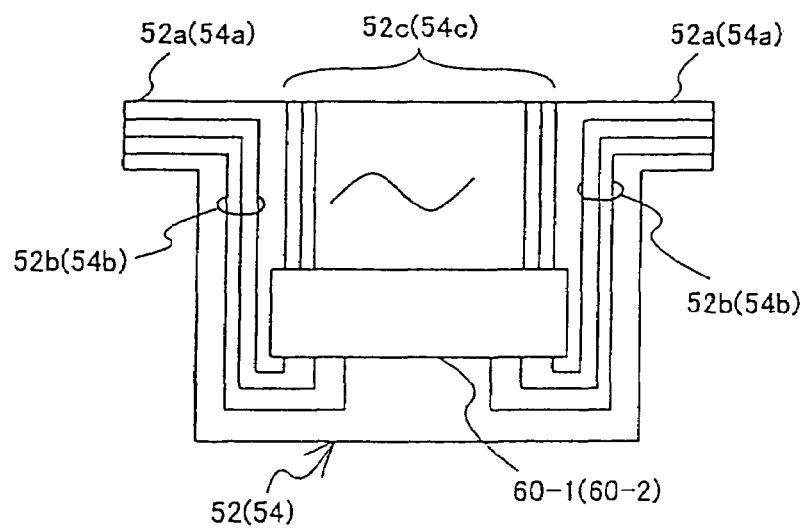
FIG. 18 is a plan view of a flexible board shown in FIG. 15.

FIG. 18 is a plan view of the flexible board 52 or 54. Although the TCP structure shown in FIG. 3 can be used for the flexible boards 52 and 54, the flexible boards 52 and 54 can also be made into the COF structure shown in FIG. 8. Drive ICs 60-1 and 60-2 are mounted on the respective flexible boards 52 and 54. The flexible boards 52 and 54 have the extension sections 52a and 54a which extend right and left, respectively, and input signal lines 52b and 54b are formed in the extension sections 52a and 54a, respectively. Output signal lines 52c and 54c are formed so as to extend toward one side of the flexible boards 52 and 54 from the mounted drive ICs 60-1 and 60-2.

The input signal lines 52b and 54b formed on the above-mentioned flexible boards 52 and 54 are arranged so as to overlap with the input signal lines 2a formed on the liquid crystal panel 2 in a state in which the flexible boards 52 and 54 are connected to the liquid crystal panel 2. That is, the input signal lines 2a formed on the liquid crystal panel 2 and the input signal lines 52b and 54b formed on the extension sections 52a and 54a of the flexible boards 52 and 54 together constitute the entire input signal lines. Thereby, even if the wiring resistance is too high only by the input signal lines 2a formed on the liquid crystal panel 2, the wiring resistance can be reduced by overlapping the input signal lines 52b and 54b formed on the extension sections 52a and 54b of the flexible boards 52 and 54, respectively. It should be noted that a relatively flexible substrate material such as polyimide is used for base films of the flexible boards 52 and 54 so that the connection board can be easily folded.

By connecting the connection board 56 and the flexible boards 52 and 54 having the above-mentioned structure to the liquid crystal panel 2 as shown in FIG. 15, the input signal lines formed on the connection board 56 and the flexible boards 52 and 54 can be overlapped with a large part of the input signal lines 2a formed on the liquid crystal panel 2, thereby reducing the wiring resistance of the entire input lines.

Figure 19:
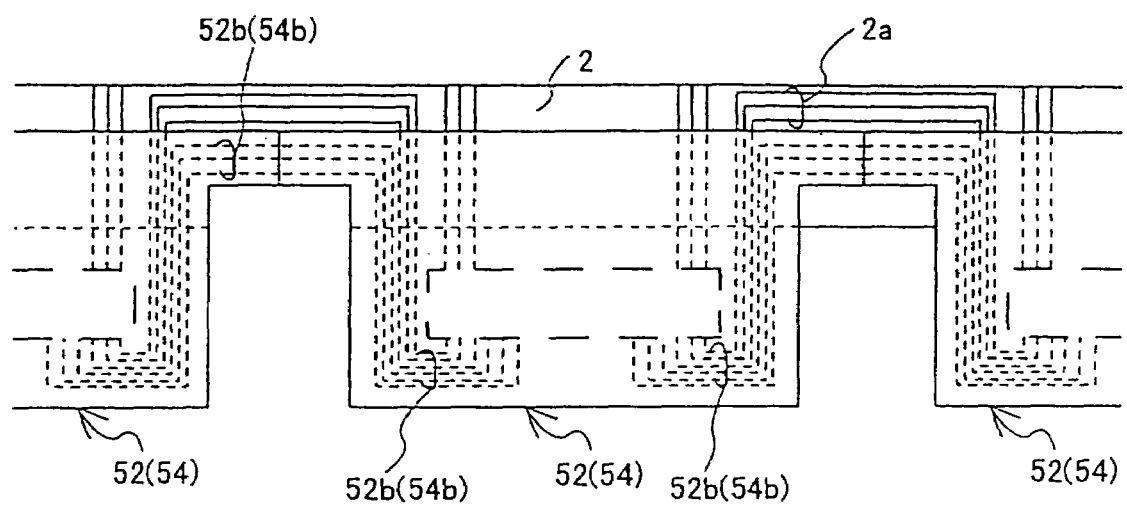
FIG. 19 is a plan view of a part of a liquid crystal display device in which a part of input signal lines are formed on the flexible boards.

Since the area where each of the flexible boards 54 and 56 and the liquid crystal panels 2 overlap with each other may be about 1 to 3 mm, there may be a case in which it is difficult to form all the input signal lines within the area. In such a case, signal lines such as a power-source line or a line of which signal waveform is easily dulled may be overlapped according to the above-mentioned overlapping structure. That is, as shown in FIG. 19, the overlapping structure may be used for the input signal lines to which a low wiring resistance is required, and signal transmission may be carried out by only the input signal lines formed on the liquid crystal panel 2 with respect to the input signal lines of which wiring resistance can be relatively high.

It is preferable that the flexible boards 52 and 54, which are adjacent to each other, are as close as possible so that the extension sections thereof almost contact with each other. That is, between the adjacent extension sections 52a and 54a, the input signals transmit only through the input signal lines 2a formed on the liquid crystal panel 2, and, thus, it is preferable to shorten such a part as much as possible so as to reduce the wiring resistance. Although it is preferable that the adjacent extension sections contact each other, when considering positioning accuracy of the flexible boards and allowable tolerance of the shape of the flexible boards, a distance between the adjacent extension sections is 0.2 to 0.5 mm.

Figures 20A, 20B:
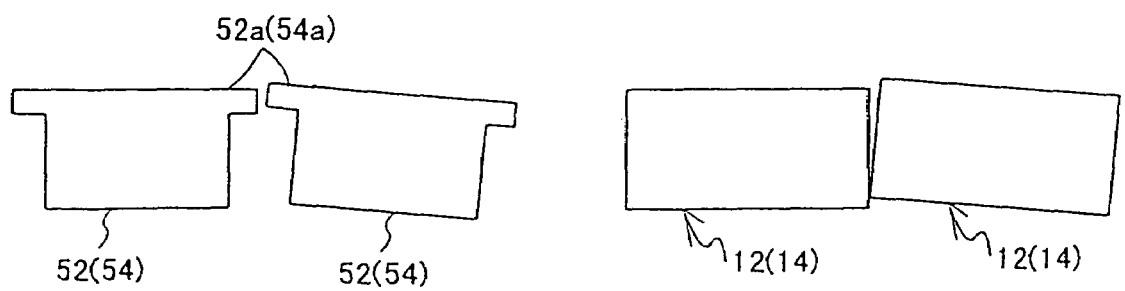
FIGS. 20A and 20B are illustrations for explaining an influence due to inclination of adjacent flexible boards.

Moreover, in a case in which the flexible boards has a simply rectangular shape as in the conventional device, when one of the adjacent flexible boards slightly inclines to the other one of the adjacent flexible boards, the flexible boards are in contact with each other as shown in FIG. 20B. However, if the flexible boards 52 and 54 having the extension sections 52a and 54a, respectively, as shown in FIG. 20A, the extension sections 52a and 54a do not contact each other even if one or both of the adjacent flexible boards are arranged in an inclined state.

Also in the above-mentioned second embodiment, a plurality of connection boards may be provided to as to supply input signals at a plurality of positions. Moreover, electronic component parts may be connected by providing terminals on the input signal lines of the flexible boards 52 and 54. Furthermore, a part of each of the flexible boards 52 and 54 can be folded along an outer configuration of the liquid crystal panel 2 so as to reduce the outside dimensions of the liquid crystal display device.

A description will now be given, with reference to FIGS. 21 through 24, of a liquid crystal display device according to the third embodiment of the present invention. Although the basic structure of the liquid crystal display device according to the third embodiment of the present invention is the same as the liquid crystal display device 30 shown in FIG. 6, the drive IC mounted on the flexible board has the terminals, which output input signals without change, and a wiring resistance of the input signal lines is maintained low by overlapping the input signal lines formed on the flexible board with input signal lines 2a formed on the liquid crystal panel 2.

Figure 4:
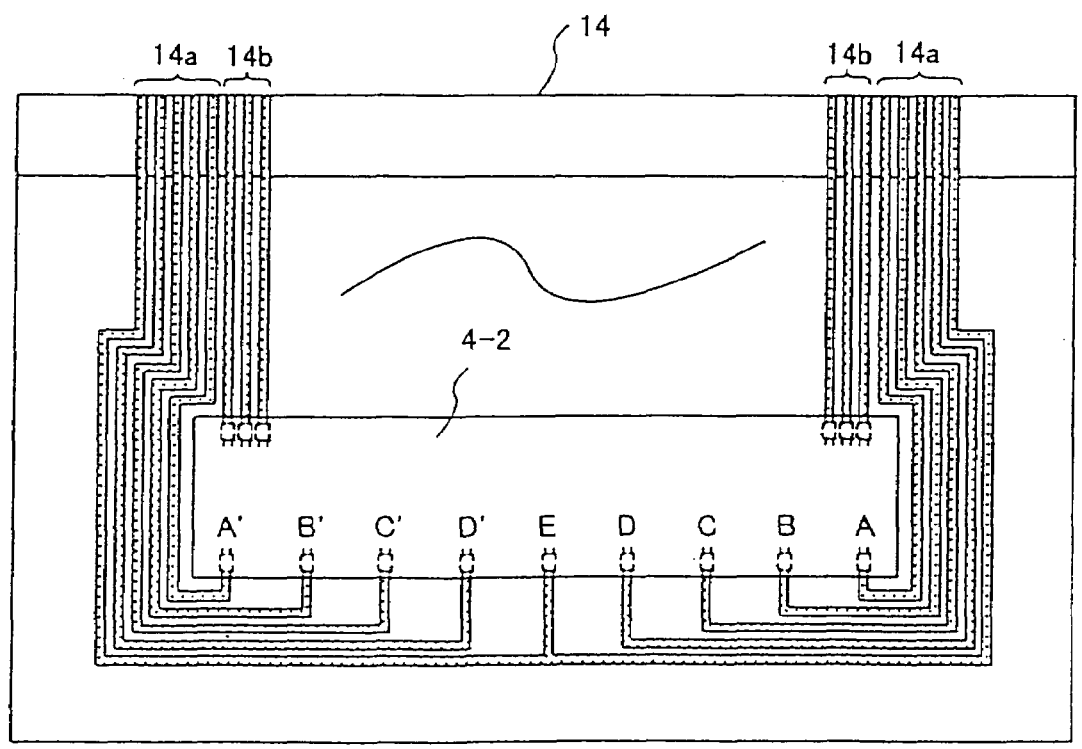
FIG. 4 is a plan view of a flexible board provided in a gate-side drive IC having input wiring terminals.
Figure 22:
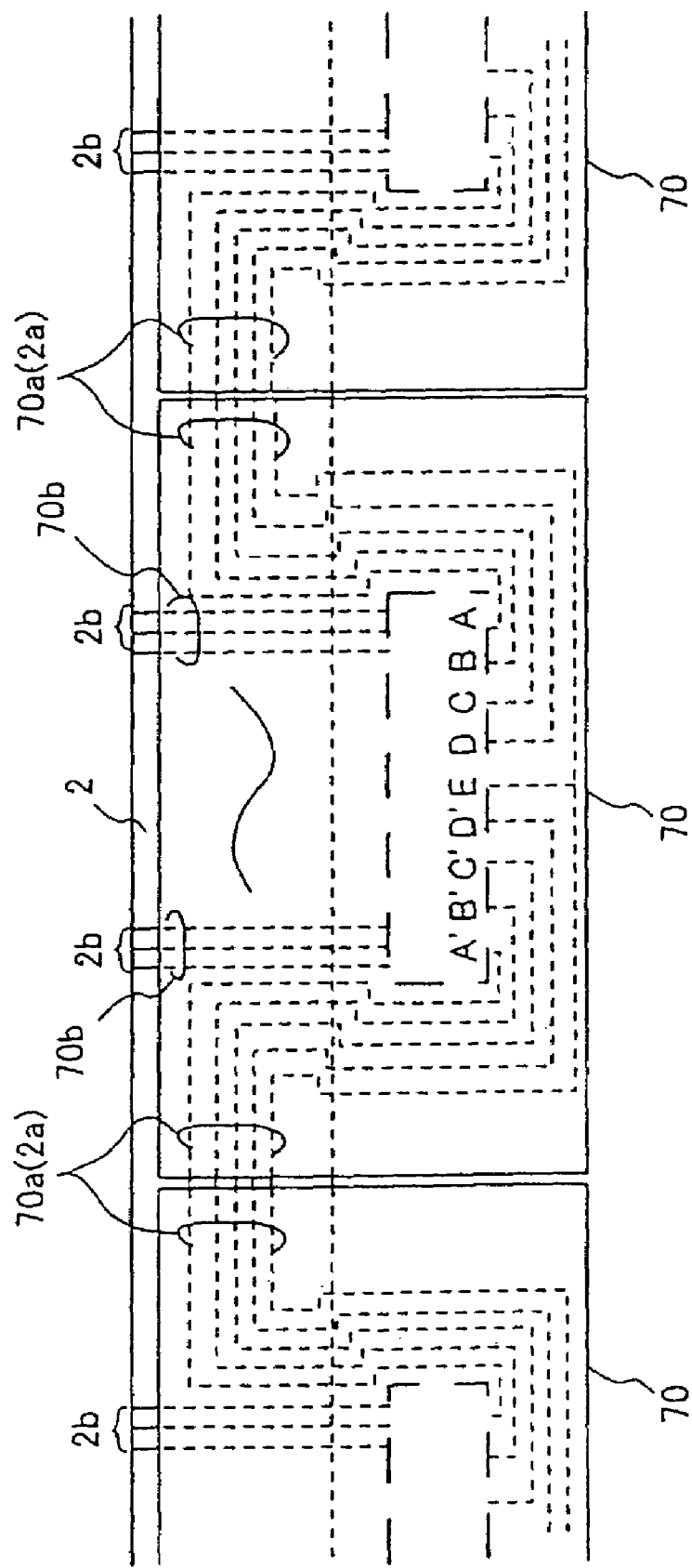
FIG. 22 is a plan view showing a state where the flexible board shown in FIG. 21 is attached to the liquid crystal panel.

FIG. 21 is a plan view of a flexible board provided to the liquid crystal display device according to the third embodiment of the present invention. FIG. 22 is a plan view showing a state where the flexible board shown in FIG. 21 is attached to the liquid crystal panel. The flexible board 70 shown in FIG. 21 comprises a drive IC 72 of the type which outputs input signals like the flexible board shown in FIG. 4. That is, a drive IC 72 has input terminals A-D, and outputs from output terminals A'-D' the input signals supplied to the input terminals A-D, respectively. Moreover, the input signal supplied to the output terminal E is output to the other end of the flexible board 70 through an input signal line. It should be noted that the flexible board 70 may be a source-side flexible board or may be a gate-side flexible board.

As shown in FIG. 21, the input signal lines 70a connected to the input terminals A-D of the drive IC 72 have parts that extend to a side section (side section on the right in FIG. 21) of the flexible board 70 in a part connected to the liquid crystal panel 2. That is, the parts of the input signal lines 70a, which extend to the side section of the flexible board 70, extend in a direction substantially perpendicular to the extension direction of the output lines 70b. The input signal supplied to the input terminals A-D of the drive IC 72 are output to the output terminals A'-D' without any change. Therefore, the input signal lines 70a extend also from the output terminals A'-D', and ends thereof extend to the opposite side section (side section on the left in FIG. 21) of the flexible board 70. Moreover, input signal lines 70a, which extend from both side sections, are connected to the input terminal E.

Here, as shown in FIG. 16, the input signal line 2a and the output signal lines 2b are formed on the liquid crystal panel 2. The input signal lines 2a are provided so as to transmit input signals between the adjacent flexible boards 70. Moreover, the output lines 2b are signal lines for transmitting the driving signals of the liquid crystal panel 2 output from the flexible board 70.

As shown in FIG. 22, the parts of the input signal line 70a that extend to the side sections of the flexible board 70 are arranged so as to accurately overlap with the input signal lines 2a of the liquid crystal panel 2 when the flexible board 70 is attached to the liquid crystal panel 2. Therefore, the entire input signal lines are formed by both the input signal lines 2a of the liquid crystal panel 2 and the input signal lines 70a of the flexible board 70. Thereby, the wiring resistance of the input signal lines can be maintained low.

Figure 23:
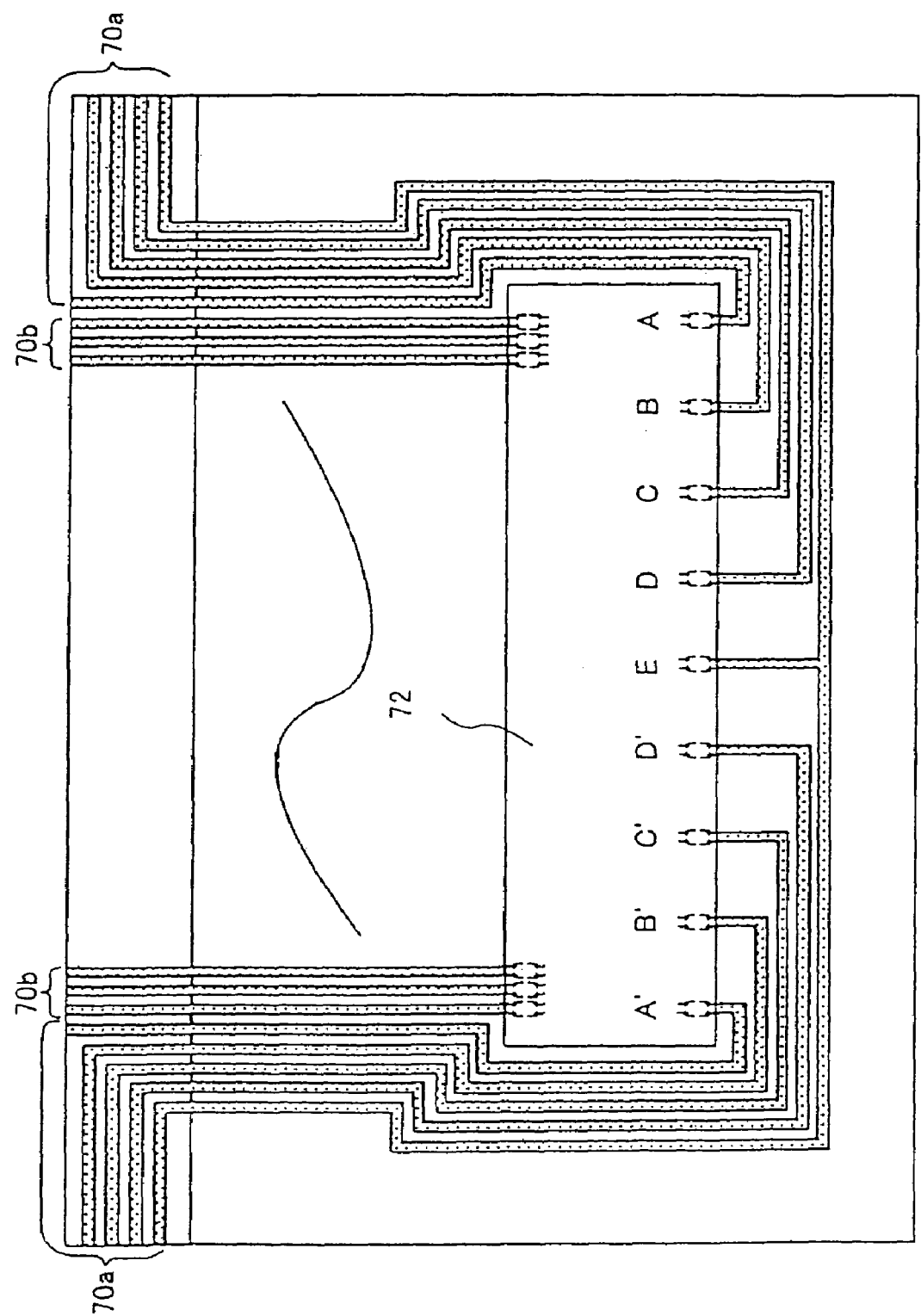
FIG. 23 is a plan view of a variation of the flexible board shown in FIG. 21.
Figure 24:
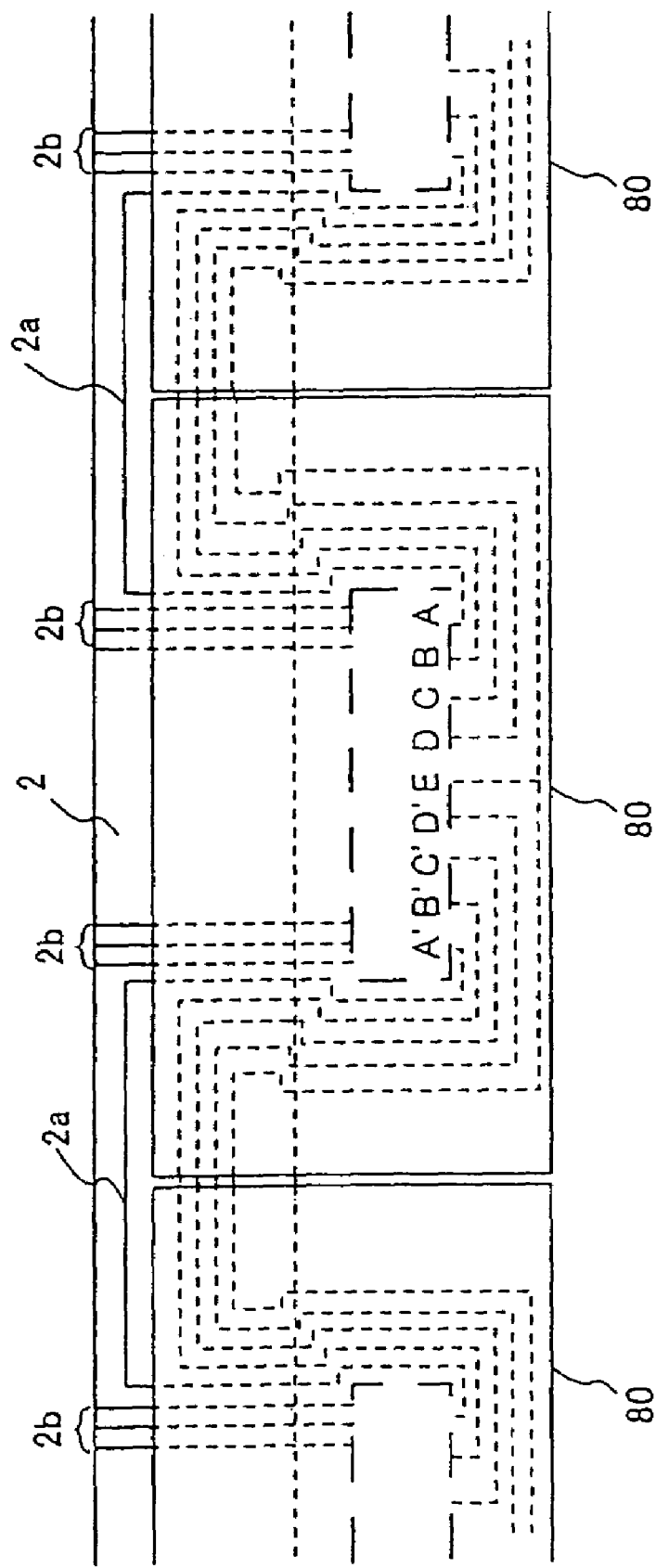
FIG. 24 is a plan view of the flexible board shown in FIG. 23 attached to the liquid crystal panel.

In the example shown in FIG. 21, although the ends of all the input signal lines 70a are overlapped with the input signal lines 2a of the liquid crystal panel 2, a part of each of the input signal lines 70a may be overlapped like a flexible board 80 shown in FIG. 23. That is, only a part of the input signal lines 70a, of which wiring resistance is required to be low, are arranged so as to overlap with the input signal lines 2a of the liquid crystal panel 2, and the rest of the input signal lines 70a are extended in a direction the same as the extension direction of the output signal line 70b. In this case, as shown in FIG. 24, the part of the input signal lines 70a of the flexible board 70 overlaps with the input signal lines 2a of the liquid crystal panel 2 arranged between the adjacent flexible boards 70, and the rest of the input signal lines 70a are connected only through the input signal lines 2a of the liquid crystal panel 2.

In the liquid crystal display device according to the above-mentioned third embodiment, input signals are supplied to each flexible board through the input signal lines formed on the liquid crystal panel 2. However, on the source side, which needs to pass a particularly large current, the input signal lines formed on the liquid crystal panel may be too thin, and, thereby, a wiring resistance may be high and a sufficient input signal may not be supplied. Thus, in a liquid crystal display device according to a fourth embodiment of the present invention, input signals are supplied to a drive IC through a wiring board as in the conventional device.

A description will be given below of a liquid crystal display device according to the fourth embodiment of the present invention. As mentioned above, although the liquid crystal display device according to the fourth embodiment of the present invention supplies input signals to a drive IC through a wiring board as in the conventional device, the configuration of the wiring board differs from the wiring board of the conventional device.

First, a description will be given, with reference to FIG. 25 and FIG. 26, of a structure of the wiring board of the conventional liquid crystal display device. FIG. 25 is a plan view showing the conventional liquid crystal display device having the wiring board.

In FIG. 25, parts that are the same as the parts shown in FIG. 1 are given the same reference numerals, and descriptions thereof will be omitted. Common input signal lines 8a for supplying input signals to each of the source-side flexible boards 12 are formed on the source-side wiring board 8 shown in FIG. 25. The input signals are supplied to each of the source-side drive ICs 4-1 by connecting input terminals of each of the source-side drive ICs 4-1 to the corresponding input signal lines 8a. Similarly, common input signal lines 10a for supplying the input signals to each of the gate-side flexible boards 14 are formed on the gate-side wiring board 10. The input signals are supplied to each of the gate-side drive ICs 4-2 by connecting input terminals of each of the gate-side drive ICs 4-2 to the corresponding input signal lines 10a.

Corresponding to the input terminals of the drive IC, many input signal lines 8a are formed on the wiring board 8 in parallel. When many input signal lines 8a are formed in the same plane, there is a problem in that the signal lines extending in a direction perpendicular to the input signal lines must cross the input signal lines so as to connect the input signal lines extending in the perpendicular direction. The conventional wiring board solved such as problem by adopting a multilayer board structure. The multilayer structure of a wiring board will be explained below.

Figure 26A:
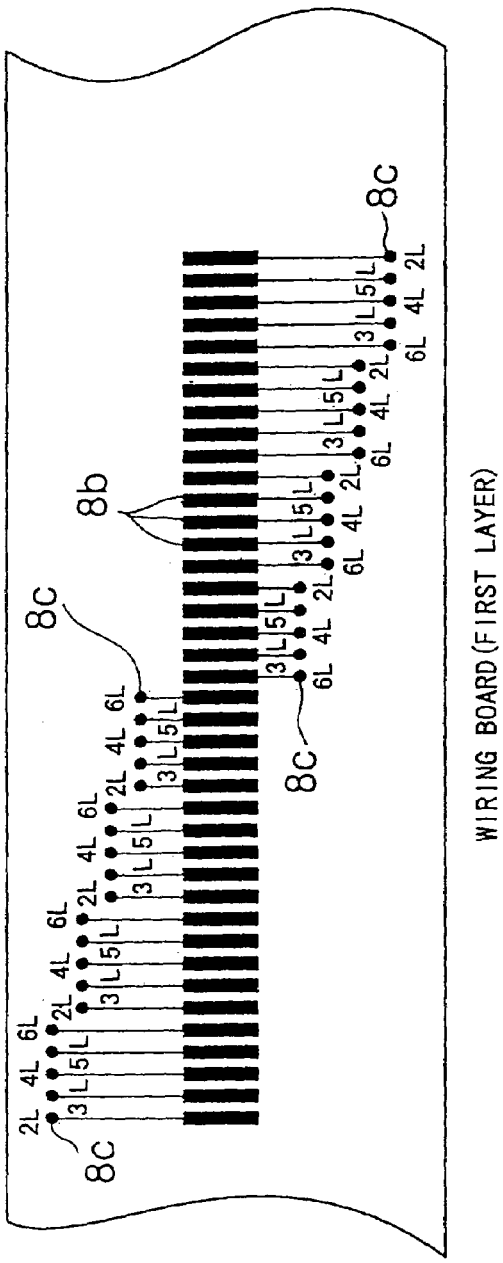
FIG. 26A is a plan view of an uppermost layer of a wiring board.
Figure 26B:
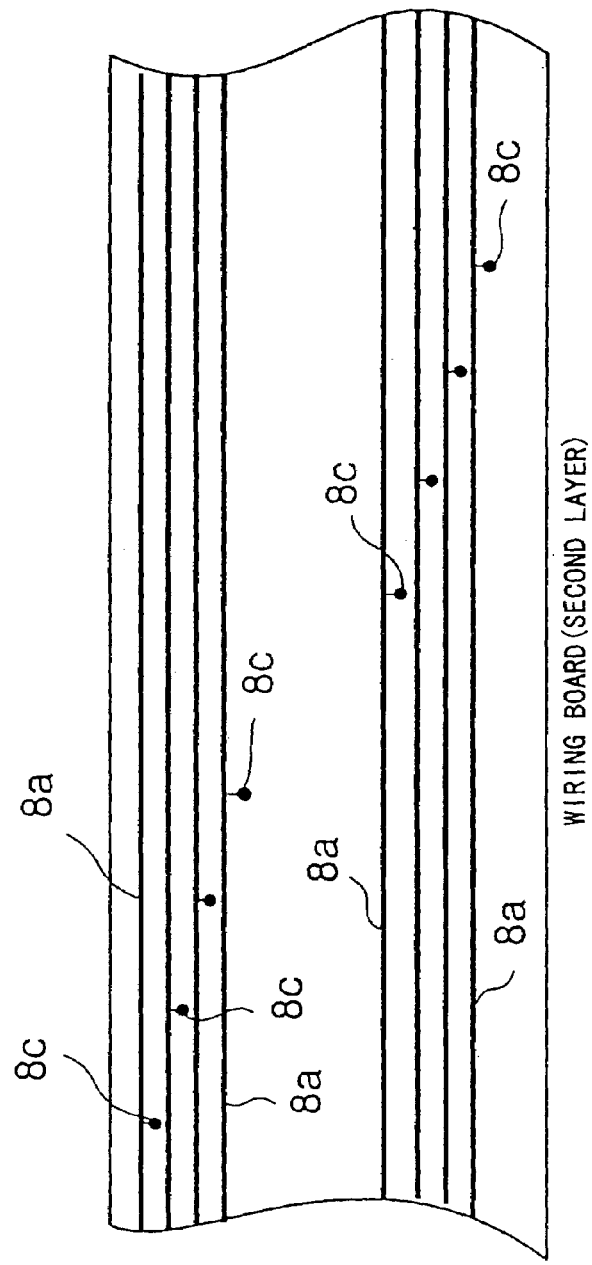
FIG. 26B is a plan view of a second layer under the uppermost layer.

FIGS. 26A and 26B are illustrations for explaining a typical configuration of the above-mentioned wiring board 8 (or 10). In the example shown in FIGS. 26A and 26B, each drive IC has input terminals and 40 input lines 8a are formed. It should be noted that FIGS. 26A and 26B show a part of the wiring board 8 corresponding to one of the source-side flexible board 12.

FIG. 26A is a plan view of an uppermost layer of the wiring board 8. 40 connection terminals 8b to be connected to the flexible board are arranged in the uppermost layer of the wiring board 8. FIG. 26B is a plan view of the second layer under the uppermost layer. 8 input signal lines are formed in the second layer. The wiring board 8 includes six layers including the uppermost layer. 8 input signal lines are formed on each of layers (second through sixth layers) under the uppermost layer. Therefore, in the entire wiring board 8, 40 (8×5=40) input signal lines 8a are formed.

Eight input signal lines 8a of the second layer are connected to the respective connection terminals 8b by through holes (via holes) 8c extending to the uppermost layer shown in FIG. 26A. For example, the through hole 8c (indicated by 2L) located in the rightmost position in FIG. 26A corresponds to the through hole 8c located in the rightmost position in FIG. 26B, and is connected to the input signal line located uppermost position in FIG. 26B. Moreover, the through hole 8c (indicated by 2L) located in the sixth position from the rightmost position in FIG. 26A corresponds to the through hole 8c located at the second position from the rightmost position in FIG. 26B, and is connected to the second input signal line from the top in FIG. 26B. According to the above-mentioned arrangement of the through holes 8c, the input signal lines 8a formed on each of the second to sixth layers are individually connected to the corresponding connection terminals formed on the uppermost layer by the through holes 8c.

Thus, the conventional wiring board 8 has a multilayer board structure so as to form many input signal lines 8a, which is one of factors that increases the manufacturing cost of the liquid crystal display device.

Then, in the fourth embodiment of the present invention, the supply of many input signals to a drive IC is enabled using the wiring board having a single layer structure which can be manufactured at a low cost.

Figure 27:
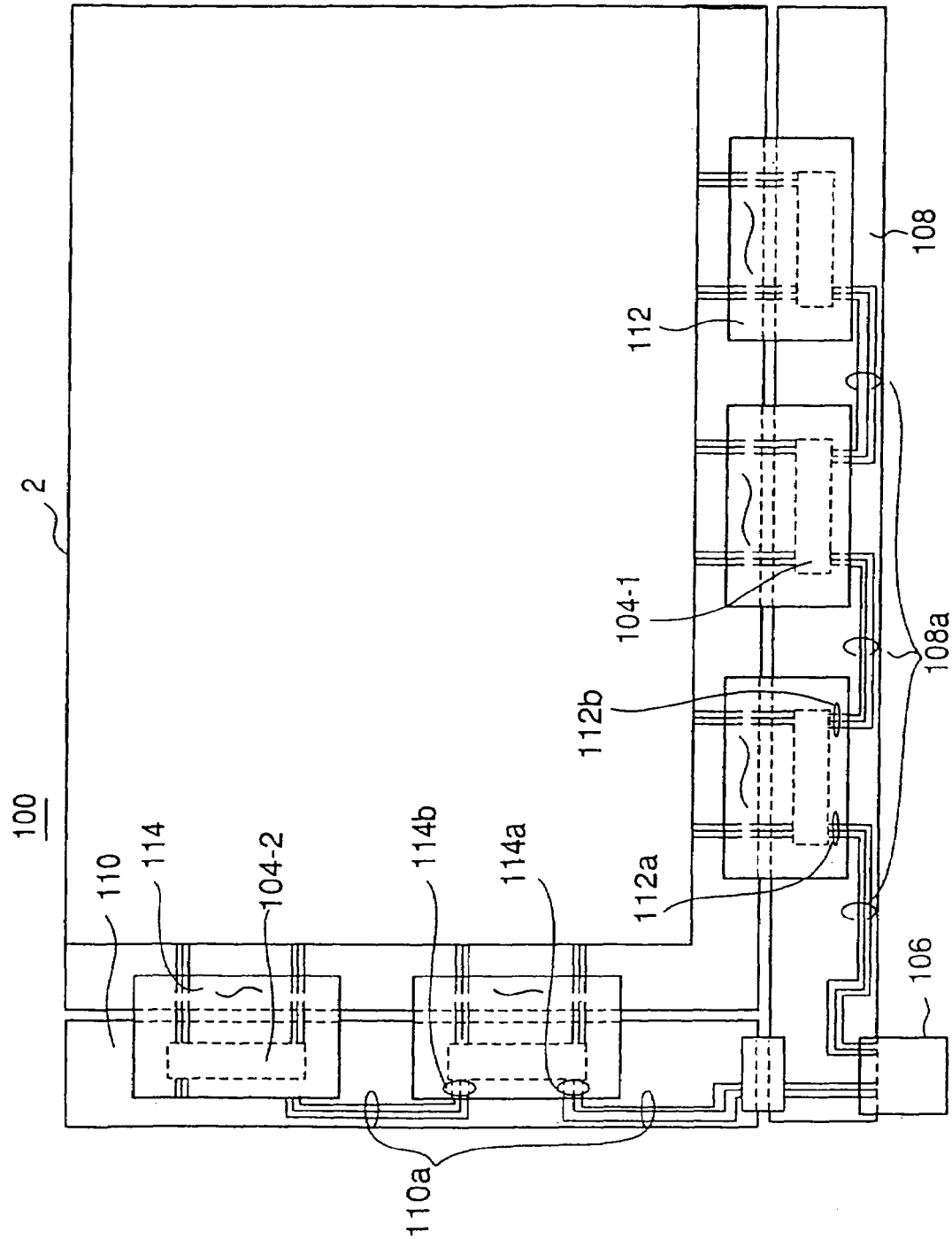
FIG. 27 is a plan view of a liquid crystal display device according to a fourth embodiment of the present invention.

FIG. 27 is a plan view of a liquid crystal display device 100 according to the fourth embodiment of the present invention. In the present embodiment, the drive IC shown in FIG. 21 used in the above-mentioned third embodiment is used as source-side drive ICs 104-1 and gate-side drive ICs 104-2. That is, the source-side drive ICs 104-1 and the gate-side drive IC 104-2 in the present embodiment have the input wiring terminals, which output the signal supplied to the input terminals without any change, and the input terminals and the input wiring terminals are arranged in a symmetrical state.

An output side of a source-side flexible board 112 on which the source-side drive IC 104-1 is mounted is connected to the liquid crystal panel 2, and an input side thereof is connected to a source-side wiring board 108. The input board 6 is connected to the source-side wiring board 108, and input signals are supplied from outside through the input board 6.

An output side of the gate-side flexible board 114 on which the gate-side drive IC 104-2 is mounted is connected to the liquid crystal panel 2, and an input side thereof is connected to the gate-side wiring board 110. The gate-side wiring board 110 is connected to the source-side wiring board 108 through the connection board 12 so that input signals are supplied from the source-side wiring board 108 through the connection board 12.

In the above-mentioned liquid crystal display devices 100, second input signal lines connected to the input terminals of the mounted source-side drive IC 104-1 and third input signal lines connected to the input wiring terminals of the source-side drive IC 104-1 are formed on the source-side flexible board 112. The second input signal lines and the third input signal lines extend parallel to each other.

First input signal lines 108a are formed on the source-side wiring board 108. The number of the first input signal lines formed on the same side of the source-side wiring board 108 is equal to the number of the input terminals of the source-side drive IC 104-1. The connection board 106 is connected to the second input signal lines 112a of the adjacent source-side flexible board 112 by the first input signal lines 108a of the source-side connection board 108. Additionally, the third input signal lines 112b of the source-side flexible board 112 are connected to the second input signal lines 112a of the adjacent source-side flexible board 112 by the first input signal lines 2a of the source-side connection board 108. Further, the third input signal lines 112b of the source-side flexible board 112 are connected to the second input signal lines 112a of the adjacent source-side flexible board 112 on the opposite side by the first input signal lines 2a of the source-side connection board 108.

As mentioned above, each of the second and third input signal lines 112a and 112b and each of the corresponding first input signal lines 108a can be connected without crossing the first input signal lined by connecting the adjacent source-side flexible board 112 in series. Therefore, there is no need to make the source-side connection board in a multilayer structure, and all of the first input signal lines 108a can be arranged on the same surface. Therefore, the source-side connection substrate 108 can adopt a single-layer structure, and can reduce the manufacturing cost of the source-side connection board 108.

The above description is regarding the structures of the source-side connection board 108 and the source-side flexible board 112. All of the signal input lines 110a of the gate-side connection board 110 can also be formed on the same surface by making the gate-side connection board 110 and the gate-side flexible board 114 in the same structure. Therefore, the gate-side connection board 110 can also adopt a single-layer structure, and can reduce the manufacturing cost of the gate-side connection board 110.

Figure 5:
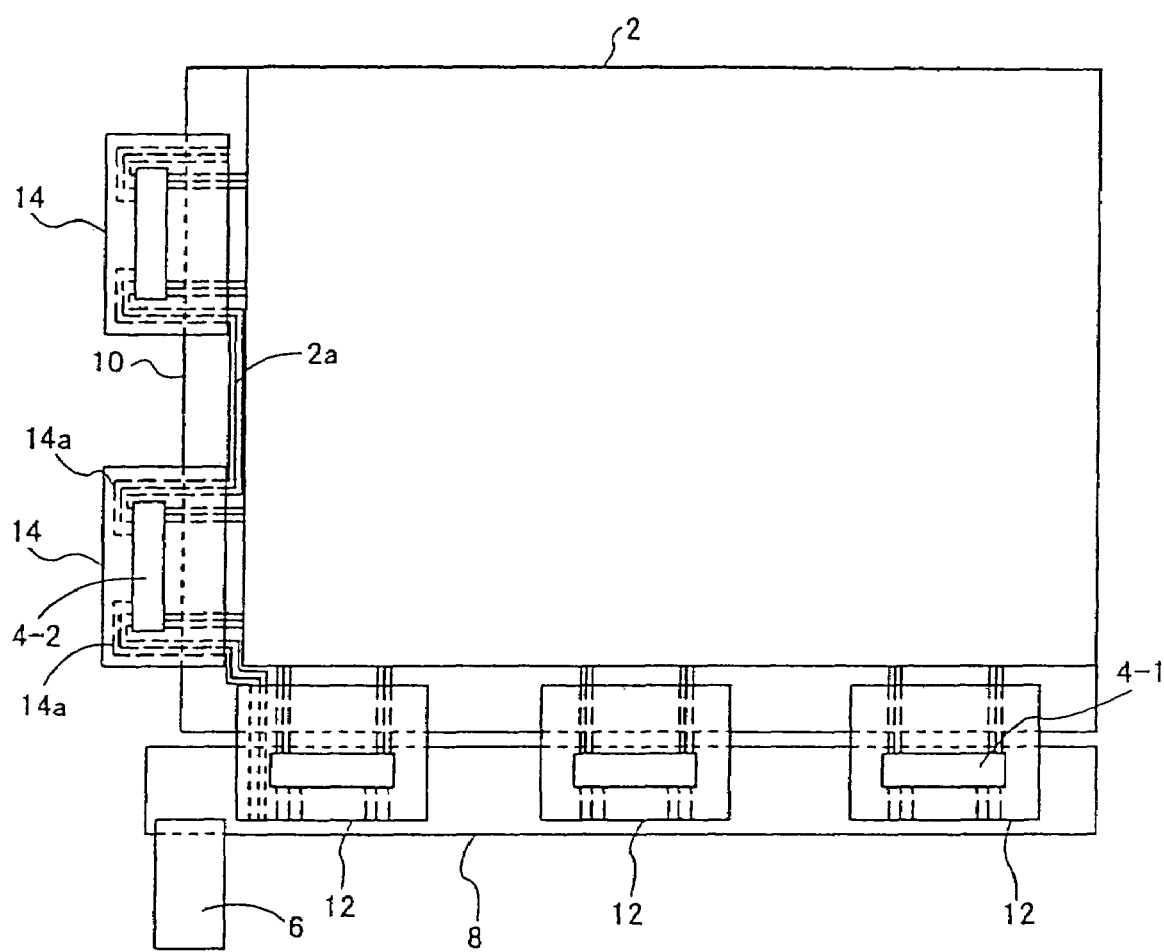
FIG. 5 is a plan view of a liquid crystal display device having a liquid crystal panel provided with input signal lines.
Figure 28:
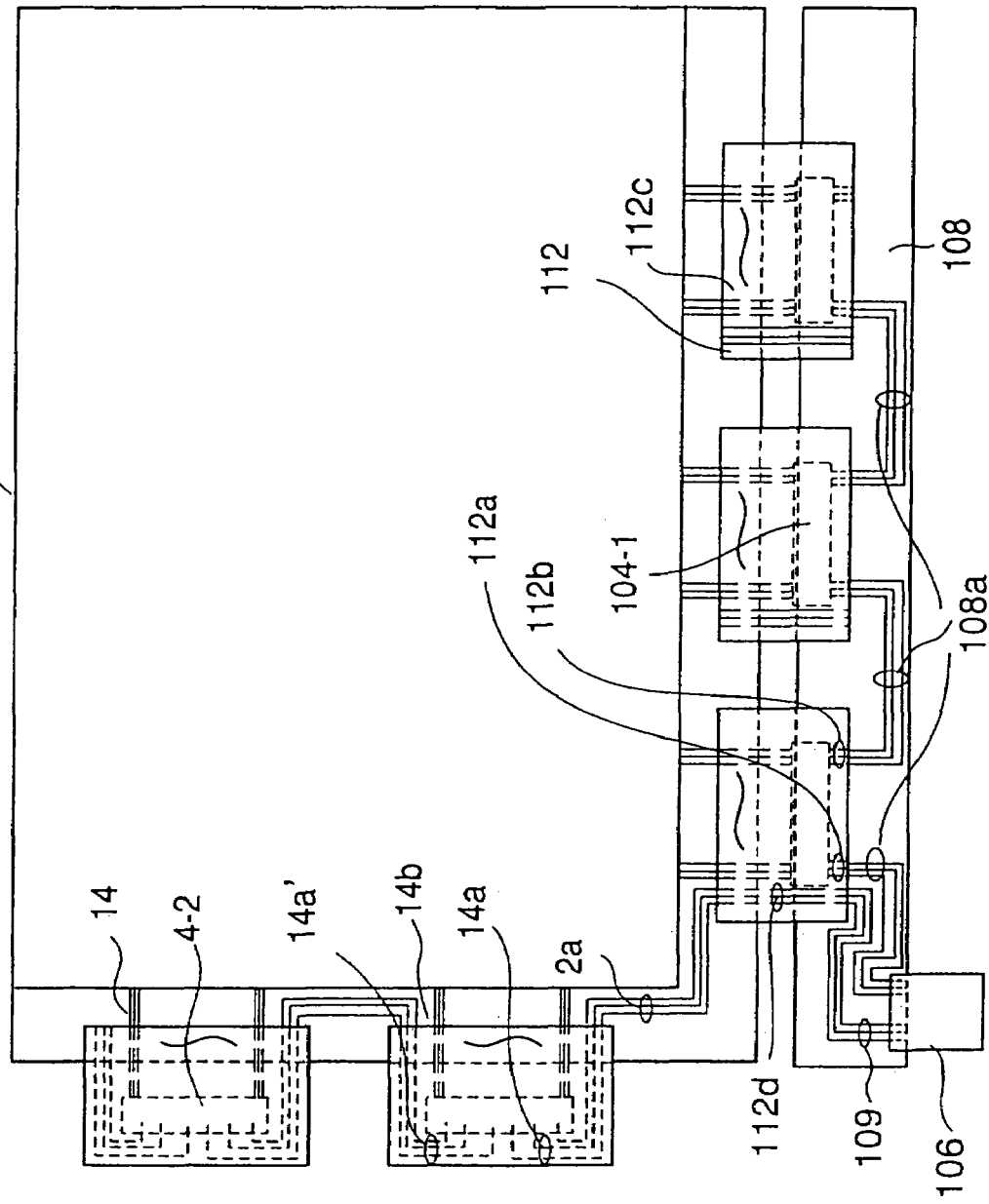
FIG. 28 is a plan view of a variation of the liquid crystal display device shown in FIG. 27.

However, the wiring resistance of the input signal lines which supply input signals to the gate-side drive IC 104-2 may be higher than the wiring resistance of the input signal lines which supply input signals to the source-side drive IC 104-1. Then, as shown in FIG. 28, the input signals may be supplied to the source-side drive IC 104-1 through the wiring board 108. That is, regarding the gate side, the gate-side flexible boards 14 may be connected in series through the input signal lines 2a formed on the liquid crystal panel 2 as shown in FIG. 5. Thereby, the gate side wiring board can be deleted and the corresponding manufacturing cost can be reduced.

Moreover, in the example shown in FIG. 28, the connection board 6 is connected only to the source-side wiring board 108, and the input signals to the gate-side drive IC 4-2 are supplied from the connection board 106 to the first input signal lines 2a of the liquid crystal panel 2 through the source-side flexible board 112 closest to the source-side wiring board 108 and the connection board 106.

Figure 29:
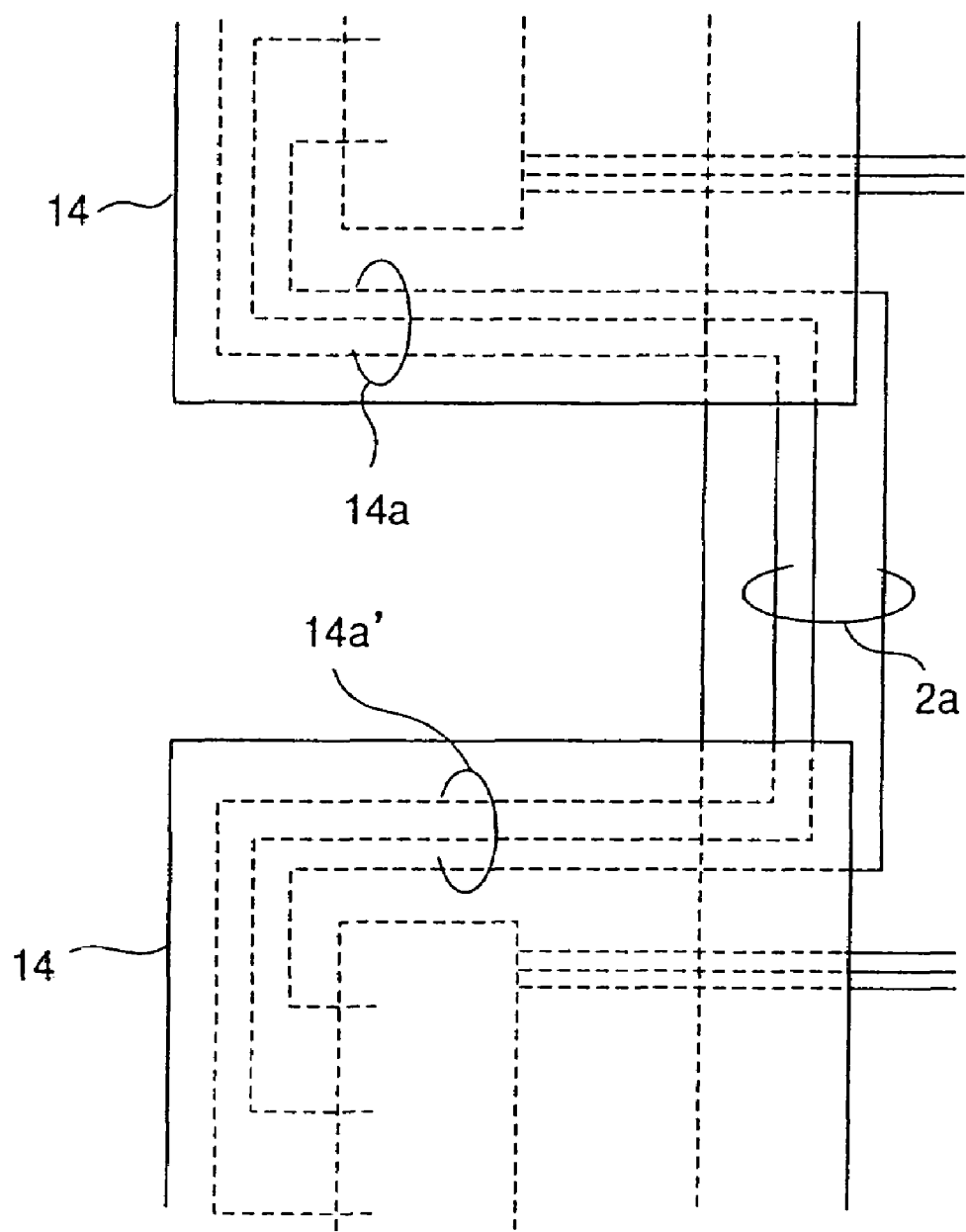
FIG. 29 is a plan view of a variation of input signal lines formed on the gate-side flexible boards shown in FIG. 28.

Moreover, the wiring resistance of the input signal lines can be reduced by increasing the pitch of the second and third input signal lines to be greater than the pitch of the output signal lines 14b. Furthermore, as shown in FIG. 29, the connection parts of the input signal lines 14a and 14a' of the gate-side flexible board 14 may be arranged in the extension direction of the first input signal lines 2a of the liquid crystal panel 2. Thereby, the wiring resistance of the first input signal lines 2a corresponding to the parts which overlap with the second and third input signal lines 14a and 14a' can be reduced. Moreover, since the width of a part in which the first input signal lines 2a of the liquid crystal panel 2 are formed is reducible, the size of the entire liquid crystal display device can be reduced.

Figure 30:
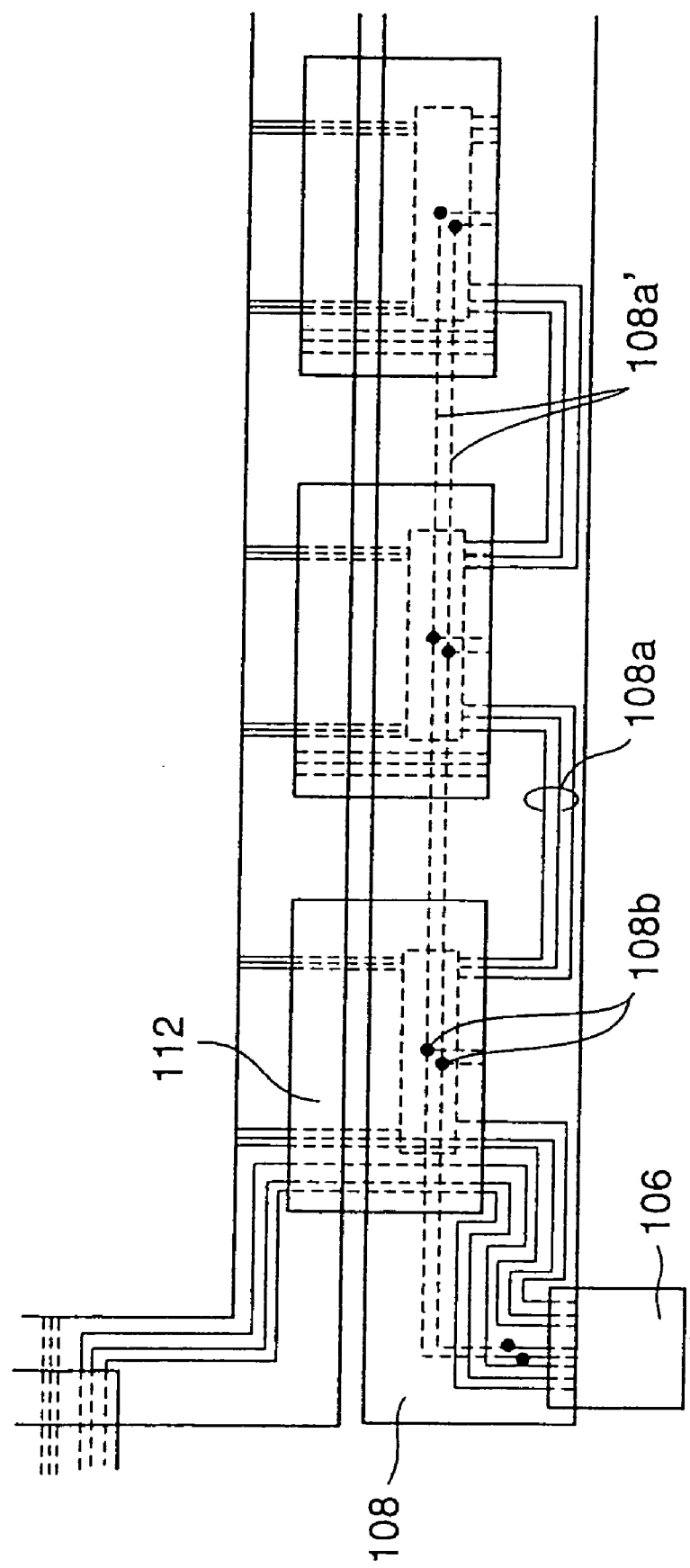
FIG. 30 is a part of a liquid crystal display device according to a fifth embodiment of the present invention.

A description will now be given of a fifth embodiment of the present invention. FIG. 30 is a plan view a part of a liquid crystal display device according to the fifth embodiment of the present invention. The liquid crystal display device according to the fifth embodiment of the present invention has the same structure as the liquid crystal display device according to the above-mentioned fourth embodiment except for the structure of source-side wiring board.

Common lines 108a' common to the source-side drive ICs 104-1, such as, for example, a power-source line or a grounding line, are included in the first input signal lines 108a formed on the source-side wiring board 108. Such common lines must have lower wiring resistance than signal lines, and need to have a larger wiring width. In the present embodiment, such common lines and signal lines are separated from each other, and, as shown in FIG. 30, the common lines 108a' (indicated by dotted lines) are formed in the back surface of the source-side wiring board 108. The common lines 108a' are pulled out through the through holes (via holes) 108b on the front surface side of the source-side wiring board 108, and are connected to the corresponding input signal lines 112a of the source-side flexible board 112.

FIGS. 31A and 31B are views for explaining the source-side wiring board 108 having a back surface formed with the common lines 108'. FIG. 31A shows the front surface of the source-side wiring board 108, and FIG. 31B shows the common lines 108' formed on the back surface of the source-side wiring board 108 viewed from the front surface side. FIG. 32 is a cross-sectional view taken along a double-dashed chain line I-I of FIG. 31A.

Connection terminals 108c, which are connecting parts with the source-side flexible board 112, are formed on the front surface of the source-side wiring board 108. In the example shown in FIG. 31, 40 connection terminals 108c are provided. Here, 4 connection terminals 108c from among the 40 connection terminals 108c are connected to the common lines 108a' shown in FIG. 32B, which are formed on the back surface of the source-side wiring board 108. That is, as shown in FIG. 32, each of the common lines 108a' formed on the back surface of the source-side wiring board 108 is connected to the respective one of the connection terminals 108c formed on the front surface side via the through holes 108b. The through hole 108b located at the rightmost position in FIG. 31A corresponds to the through hole 108b located at the rightmost position in FIG. 31B, and the through hole 108b located at the second position from the rightmost position in FIG. 31A corresponds to the through hole 108b located at the second position from the rightmost position in FIG. 31B. Similarly, the locations of the through holes 108b shown in FIG. 31A correspond to the respective locations of through holes 108b shown in FIG. 31B, and the source-side wiring board 108 has a structure in which the wiring pattern of the front surface shown in FIG. 31A overlap with the wiring pattern of the back surface shown in FIG. 31B and the front side and the back side are connected by the through holes 108b.

As shown in FIG. 32, in the source-side wiring board 108 according to the present invention, the wiring pattern is formed by etching a wiring material 122 such as copper foils attached to both sides of a wiring base material 120 formed of glass epoxy or the like. That is, the wiring pattern corresponding to the input signal lines 108a and the connection terminals 108c is formed on the front surface side, and the wiring pattern corresponding to the common lines 108a' is formed on the back surface side. Then, the through holes 108b are formed by providing penetrating holes extending between the front surface and the back surface of the wiring base material 120 and applying through hole plating. At this time, the through hole plating is also applied to the connection terminals 108c and the common lines 108a'. Parts which are not used for connection are covered with a solder resist 124 except for the periphery of the connection terminals 108c and the through holes 108b.

It should be noted that although the common lines are formed on the back surface of the source-side wiring board having a single-layer structure shown in FIG. 32, the source-side wiring board may have a multi-layer structure and the common lines may be provided on a surface different from the front surface of the source-side wiring board.

Figure 33:
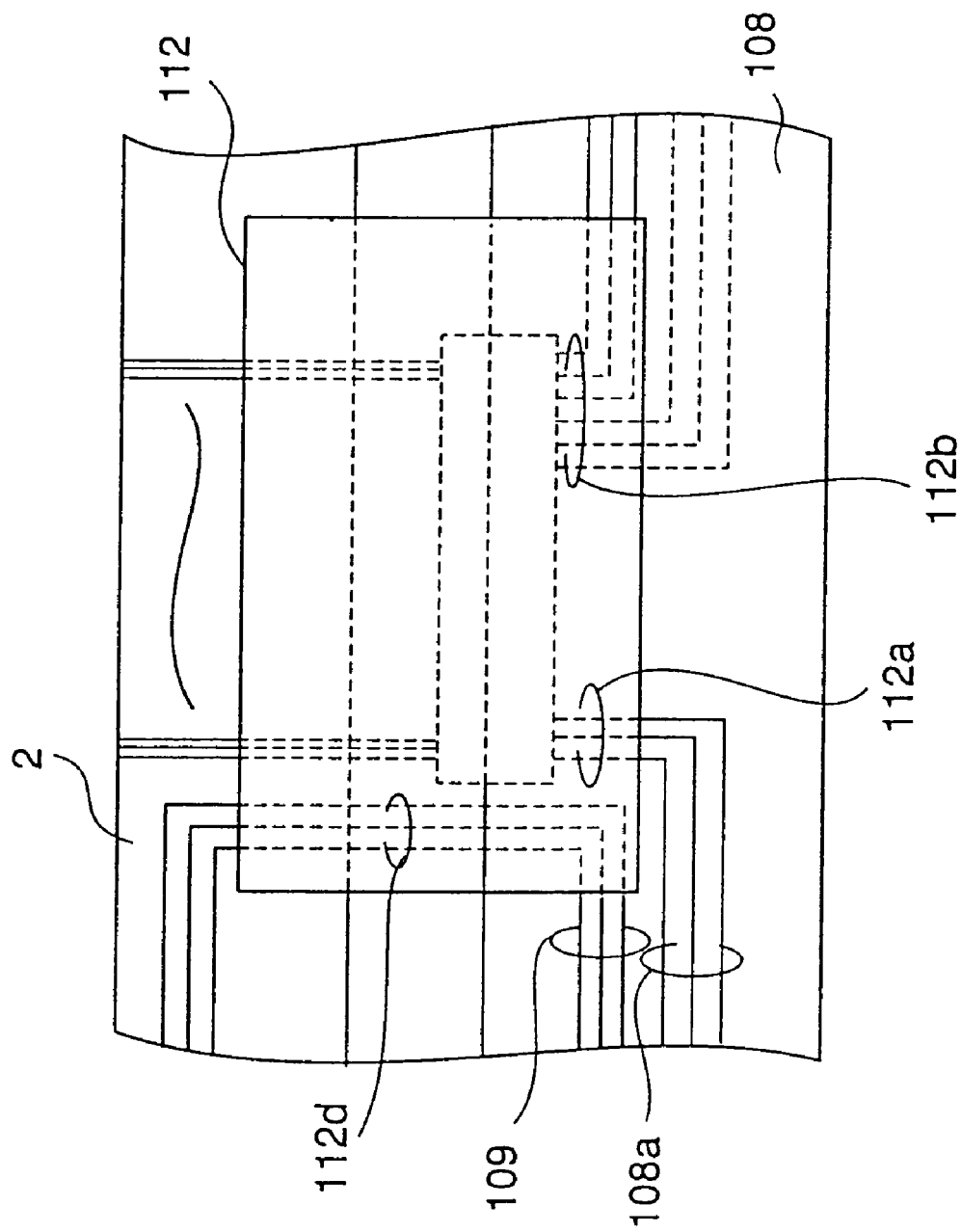
FIG. 33 is a plan view showing a wiring structure of the source-side flexible board.

FIG. 33 is a plan view showing the wiring structure of the source-side flexible board 112. The source-side flexible board 112 shown in FIG. 33 is one of the source-side flexible boards 112 close to the input board 6, and second relay input signal lines 112b are formed so as to connect the first input signal lines 108a of the source-side wiring board 108 to the first input signal line 2a of the liquid crystal panel 2. The second relay input signal lines 112d extend along the extending direction of the first input signal lines 108a in a part where the second relay input signal lines 112d are connected to the first relay signal input line 109 of the source-side wiring board 108. Additionally, a part of the third signal input lines 112b of the source side flexible board 112 also extends along the extension direction of the first input signal lines 108a. Moreover, although not shown in FIG. 33, a part of the second input signal lines 112a of the source-side flexible board 112 may also extend along the extension direction of the first signal input line 108a in the source-side flexible board 112 to which the second relay input signal lines 112 are not provided.

Thus, by forming the wiring of the source-side flexible board 112 so as to extend along the first input signal lines 108a of the source-side wiring board 108, the area (width) of the source-side wiring board 108 can be decreased, which reduces the overall size of the liquid crystal display device.

Figure 34:
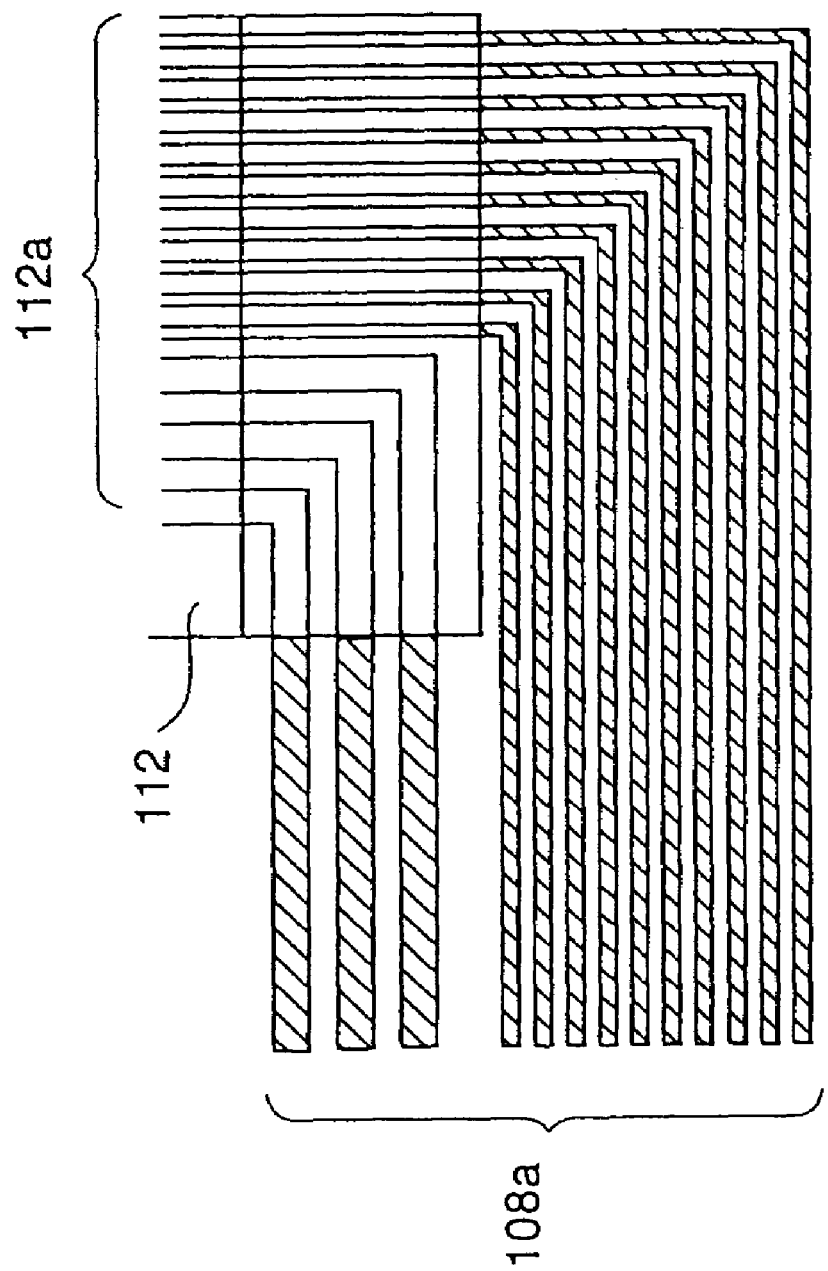
FIG. 34 is a plan view of a part in which a part of second input signal lines of the source-side flexible board extends along an extension direction of first input signal lines.

FIG. 34 shows a part in which a part of the second input signal lines 112a of the source-side flexible board 112 extends along the extension direction of the first input signal lines 108a. The second input signal lines extending in the extension direction of the first input signal lines 108a among the second input signal lines 112a extending along the extension direction of the first input signal lines 108a are formed so that their width and pitch are larger than that of other second input signal lines 112a. Thereby, if a position offset occurs in a direction perpendicular to the extending direction of the first input signal lines 108a when positioning the source-side wiring board 108 and the source-side flexible board 112, or if a small position offset occurs in a rotational direction, an offset of the second input signal lines extending in the extension direction of the first input signal lines 108a is permissible.

A description will now be given of another mode for carrying out the present invention.

Generally, drive signals are supplied to a liquid crystal display device formed on a TFT glass substrate (liquid crystal panel) from liquid crystal drive ICs mounted on flexible boards such as chip-on-film (COF) substrates. The flexible boards on which the liquid crystal drive ICs are mounted are connected to a periphery of the TFT glass substrate. Additionally, in order to supply signals to the liquid crystal drive ICs mounted on the flexible boards, another flexible board on which a circuit pattern for input signals is formed is further connected to the flexible boards having the drive ICs or the TFT glass substrate.

Figure 35:
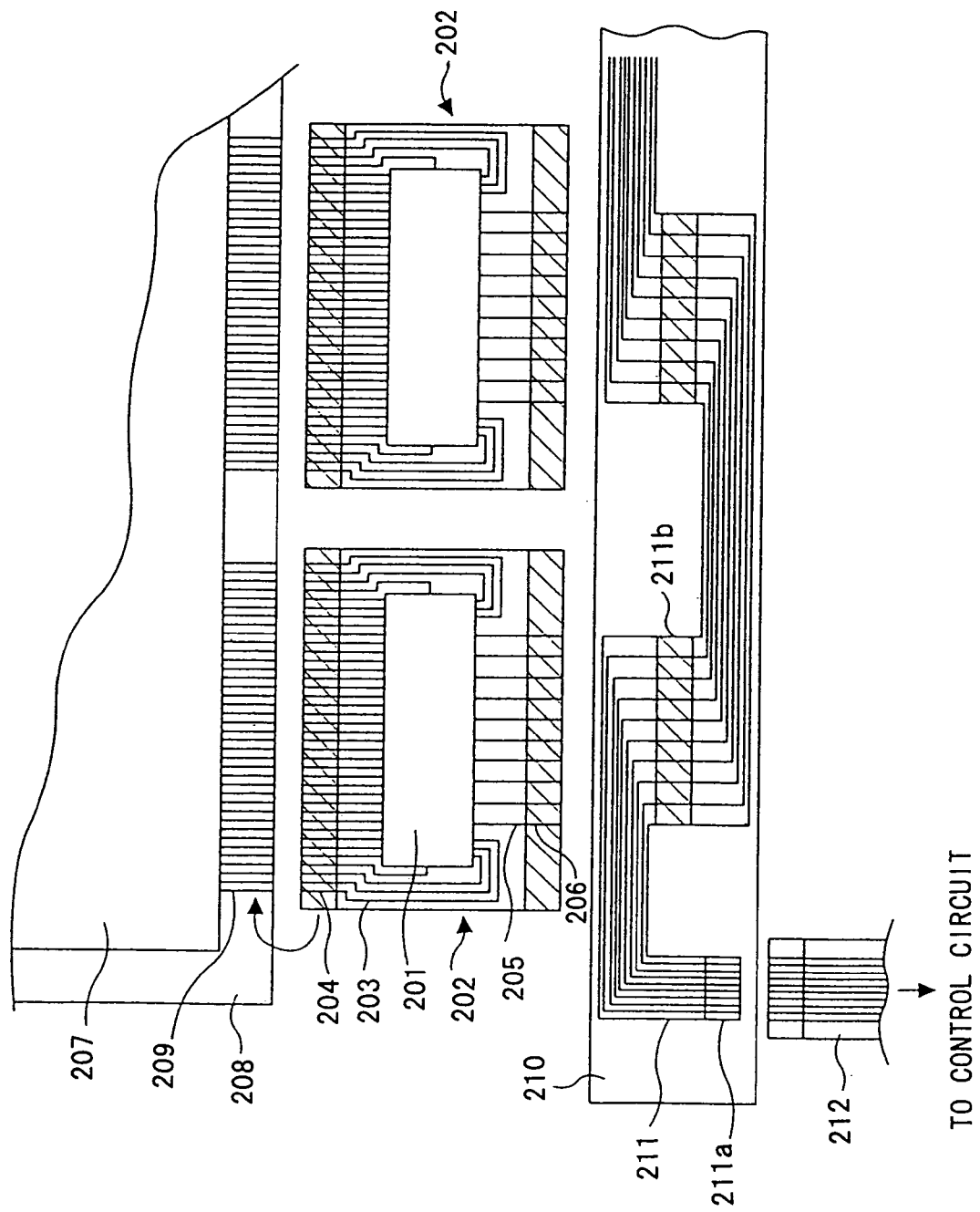
FIG. 35 is a plan view showing a structure to connect the flexible printed circuit board for supplying input signals to the flexible board on which a liquid crystal drive IC is mounted.

FIG. 35 shows a structure to connect the flexible printed circuit board for supplying input signals to the flexible board on which the liquid crystal drive IC is mounted. In FIG. 35, each of the COF substrates 202 which is the flexible board on which the liquid crystal drive IC 201 is mounted is connected to the TFT glass substrate 208 which is provided with a common glass substrate 207 having a liquid crystal display part formed thereon. The liquid crystal drive IC 201 is mounted in the center of the COF substrate 2. Circuit patterns (output signal lines) 203 connected to output terminals of the liquid crystal drive IC 201 extend to one side of the COF substrate 2, and tip parts thereof serve as COF output side terminals 204. On the other hand, circuit patterns (input signal lines) 205 connected to input terminals of the liquid crystal drive IC 201 extends in a direction opposite to the output signal lines 203, and are gathered on an opposite side of the COF substrate 202 so that tip parts thereof serve as COF input side terminals 206.

The output signal lines 203 and the input signal lines 205 which are formed on the COF substrate 202 are covered by a resist except for a part (hatched part in the figure) in which the COF output side terminals 204 and the COF input side terminals 206 are provided.

The COF substrate 202 is connected to the TFT glass substrate 208 which it provided on the periphery of the common glass substrate 207 having the liquid crystal display part thereon, and each of the COF output terminals 204 are connected to corresponding glass substrate input terminals 9 formed on the TFT glass substrate 208. Thereby, the output of the drive IC 201 is supplied to the liquid crystal display part through the output signal line 203, the COF output side terminals 204 and the glass substrate input terminals 209.

On the other hand, an input line printed circuit board 210 for input lines is connected to the COF input terminals 6 of the COF substrate 202. The input line printed circuit board 210 is connected in common to a plurality of COF substrates 2. The input lines 11 for supplying input signals to a plurality of COF substrates 202 are formed on the input line printed circuit board 10. An FPC cable 212 for supplying input signals from an external control circuit is connected to an end 211a of the input lines 211. The input lines 211 extend along the plurality of COF substrates 202 to which input line printed circuit board 210 is connected, and input line input terminals 211b are formed on positions corresponding to COF input terminals 6 of the COF substrates 202. In a state where the input line printed circuit board 210 is connected to the COF substrates, the input line input terminals 211b are connected to the COF input terminals 206 of each of the COF substrates 202. Thereby, the input signals supplied to the ends 211a of the input lines 211 are supplied sequentially to the COF substrates 202 one after another through the input lines 211 and the input line input terminals 211b.

According to the above-mentioned structure, the input signals supplied from an external control circuit is supplied to the COF substrates 202 through the input line printed circuit board 210 are converted into liquid crystal drive signals by the drive ICs 201, and the liquid crystal drive signals are supplied to the TFT glass substrate 208.

Figure 36:
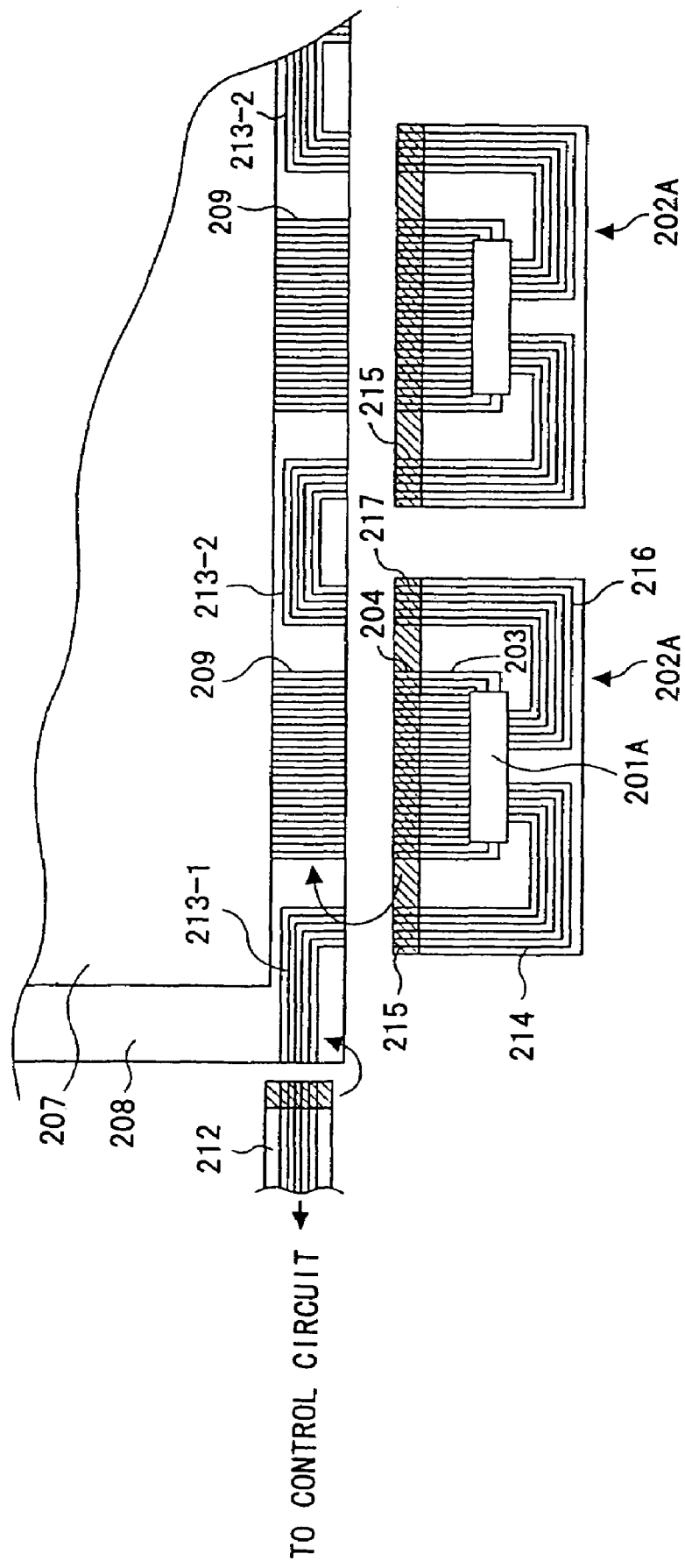
FIG. 36 is a view for explaining a structure to supply input signals to a plurality of COF substrates without using an input line printed circuit board.

Moreover, another method has been suggested which supplies input signals to the COF substrates 202 without using the input line printed circuit board 210. FIG. 36 is a view for explaining a structure to supply input signals to a plurality of COF substrates without using the input line printed circuit board by forming input lines on the TFT glass substrate.

With the structure shown in FIG. 36, the FPC cable 212 for supplying input signals from an external control circuit is connected to the TFT glass substrate 208. On the TFT glass substrate 208, internal lines 213-1 are formed as input signal lines, and input signals are supplied to the COF substrates 202A through the internal lines 213-1.

Each liquid crystal drive IC 201A used in the structure shown in FIG. 36 is provided with terminals for outputting the input signals without any change. The input signal lines 214 of the liquid crystal drive IC 201A make a U-turn on the COF substrate 202A, and COF input terminals 215 are provided on the same side as the COF output terminal 204. Moreover, each COF substrate 202A is provided with reinput signal lines (or input wiring lines) 216 connected to the terminals which output input signals without any change. The reinput signal lines 16 make a U-turn on the COF substrate 202A, and COF reinput terminals 217 are provided on the same side as the COF output terminals 204. That is, on one side of the COF substrate 202A, the COF input terminals 215 and the COF reinput terminals 217 are aligned right and left with the output terminals 204 inserted therebetween.

On the other hand, in addition to the internal lines 213-1, internal lines (COF connection lines) 213-2 are also formed on the TFT glass substrate 208 so sa to connect the COF reinput terminals 217 of the COF substrates 202A to the COF input terminals 215 of the adjacent COF substrate 202A. The input signals input from the FPC cable 212 according to the above-mentioned structure are supplied to the COF substrates 202A through the internal lines 213-1 of the TFT glass substrate 8, and the liquid crystal drive signals generated by the liquid crystal drive ICs 201A are supplied to the glass substrate input terminals 209 of the TFT glass substrate 208. Simultaneously, the input signals supplied to the liquid crystal drive ICs 201A are output from the terminals, which outputs the input signals without any change, are supplied to the COF reinput terminals 217 through the reinput signal lines 216, and are supplied to the COF input terminals 15 of the adjacent COF substrates 202A through the internal lines 213-2 of the TFT glass substrate 208. Therefore, the input signals supplied from the FPC cables 212 are sequentially supplied to the adjacent COF substrates 202A through the internal lines 213-1 and 213-2 formed on the glass substrate 208 and the input signal lines 214 and the reinput signal lines 216 provided on each COF substrate 202A.

However, according to the structure shown in FIG. 35, since the input line printed circuit board 210 must be provided so as to connect a plurality of COF substrates 202, a process for connecting the input line printed circuit board 210 is needed in the process of manufacturing the liquid crystal display device. For this reason, the number of manufacturing processes of the liquid crystal display device is increased, and the components cost of the input line printed circuit board 10 is included in the manufacturing cost of the liquid crystal display device.

On the other hand, with the structure shown in FIG. 36, although the input line printed circuit board 210 is not used, a process for connecting the FPC cable 212 to the TFT glass substrate 208 is required, thereby increasing the number of manufacturing processes of the liquid crystal display device.

Thus, in order to eliminate the above-mentioned problem, the following embodiments of the present invention provide a liquid crystal display device in which input signals can be supplied to the liquid crystal drive IC without using wiring board other than the flexible bard on which the drive IC is mounted.

A description will now be given of a liquid crystal display device according to a sixth embodiment of the present invention.

Figure 37:
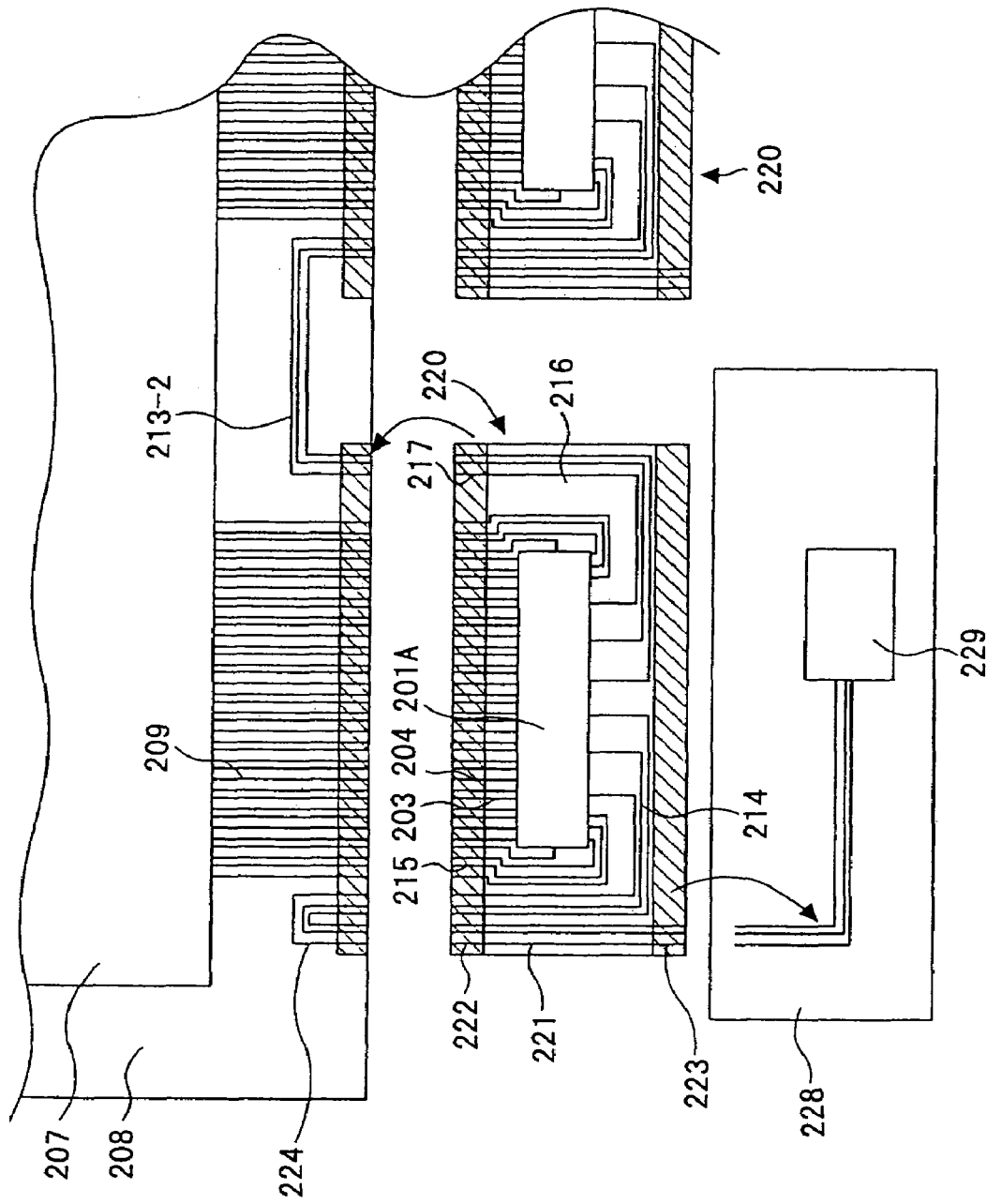
FIG. 37 is an exploded view of a part of a liquid crystal display device according to a sixth embodiment of the present invention.

FIG. 37 is an exploded view of a part of a liquid crystal display device according to the sixth embodiment of the present invention. In FIG. 37, parts that are the same as the parts shown in FIG. 36 are given the same reference numerals, and descriptions thereof will be omitted.

In the present embodiment, the input signals are supplied to the liquid crystal display device without using the input line printed circuit board 210 shown in FIG. 35. The liquid crystal display device according to the present embodiment has a structure in which a plurality of flexible boards 220 are connected to the TFT glass substrate 8. Although each flexible board 220 is constituted by, for example, a COF substrate or a TAB substrate, etc., a COF substrate is used in the present embodiment. Hereafter, the flexible board 220 is referred to as COF substrate 220. The liquid crystal drive IC 201A having the terminals, which outputs the input signals without any change, is mounted on each of the COF substrates 220.

Although the COF substrate 220 has basically the same structure as the COF substrate 202A shown in FIG. 36, there is a difference in that COF through lines 221 are provided to the COF substrate 220. The COF through lines 221 extended between a side of the COF substrate 220 provided with the COF output terminals and an opposite side of the COF substrate 220. That is, the COF through lines extend between through line output terminals 222, which are provided on the side where the COF output terminals are located, and through line input terminals 223, which are provided on the opposite side.

Corresponding to the through line output terminals 222, signal return lines 224 are formed on the TFT glass substrate 208. In a state where the COF substrates 220 are connected to the TFT glass substrate 208, ends of the signal return lines 224 are connected to the through line output terminals 222. The signal return lines 224 are turned in a U-shape on the TFT glass substrate 208, and the other ends of the signal return lines 224 are connected to COF input signal terminals 215 of the COF substrate 220.

The through line input terminals 223 of the COF substrate 220 are connected to a control circuit board 228 on which a control circuit 229 is mounted, and input signals from the control circuit 229 are supplied to the through line input terminals 223 of the COF substrate 220.

Figure 38:
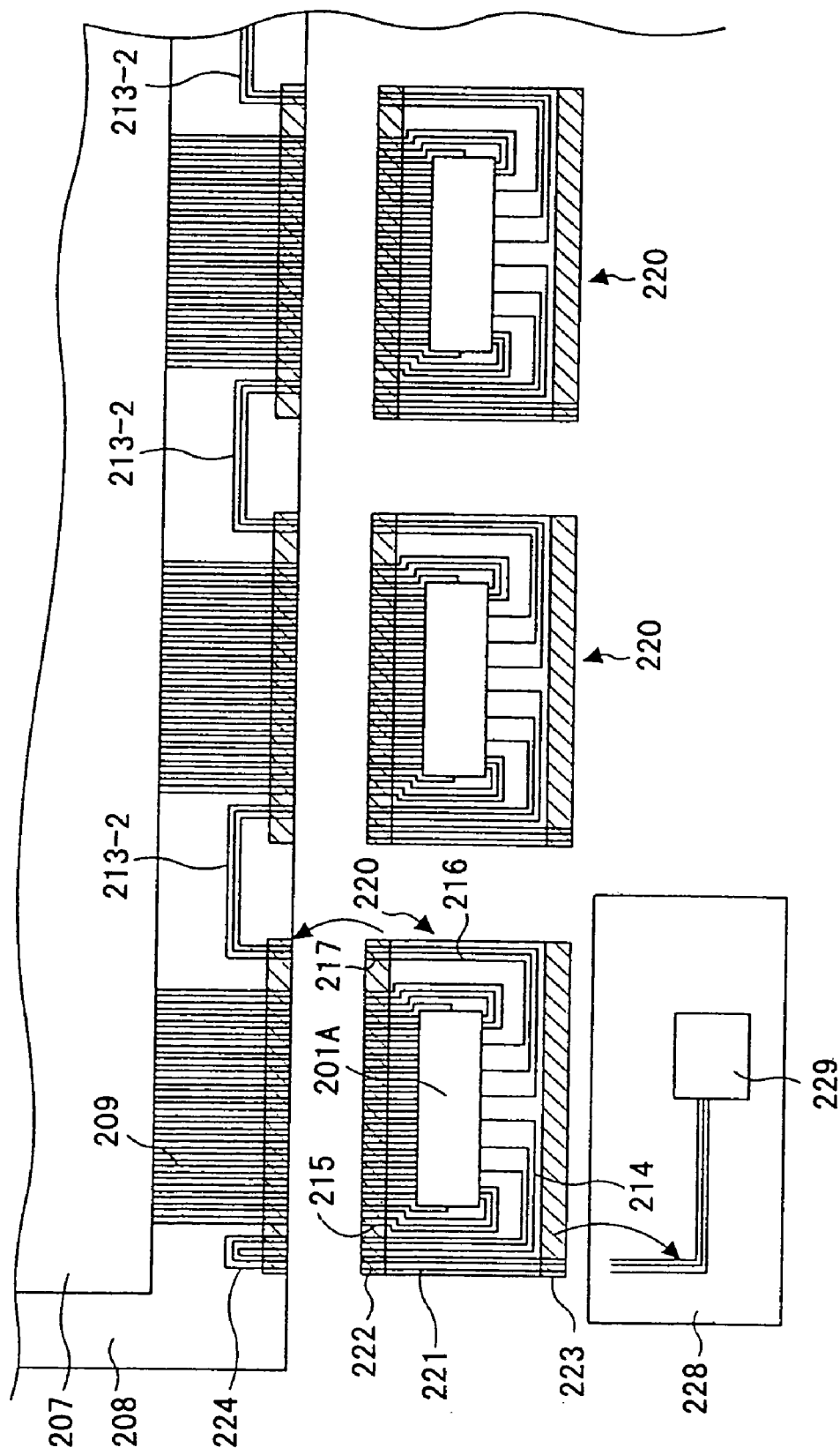
FIG. 38 is a plan view showing the structure shown in FIG. 37 in a larger range.
Figure 39:
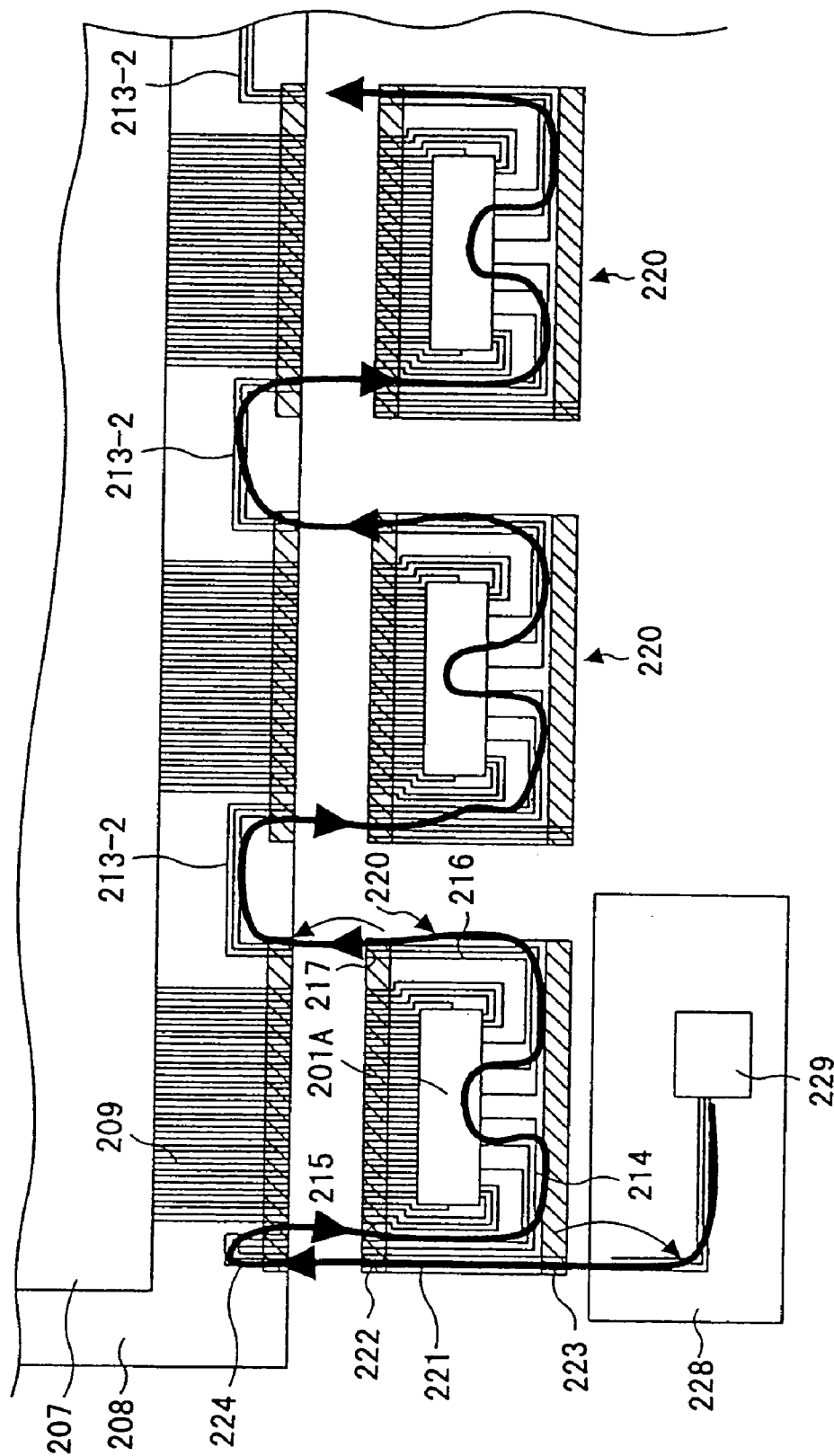
FIG. 39 is a plan view showing the same structure as that shown in FIG. 38 with a supply path of the input signals indicated by arrows.

Next, a description will be given, with reference to FIGS. 38 and 39, of a supply path of the input signals in the liquid crystal display device according to the present embodiment. FIG. 38 shows the structure shown in FIG. 37 in a larger range. FIG. 39 shows the same structure as that shown in FIG. 38 with the supply path of the input signals indicated by arrows.

In the structure according to the present invention, the input signals supplied to the through line input terminals of the COF substrate 220 are supplied to the signal return lines 224 of the TFT glass substrate 208 via the through lines 221 and the through line output terminals 222 of the COF substrate 220, and are supplied to the COF input terminals 215 of the COF substrate 220.

The input signals supplied to the COF input terminals 215 are supplied to the liquid crystal drive IC 201A through the input signal lines 214. The liquid crystal drive IC 201A generates a liquid crystal drive signals based on the supplied input signals. The generated liquid crystal drive signals are supplied to the glass substrate input terminals 209 of the TFT glass substrate 208 through the output signal lines 203 and the COF output terminals 204. Simultaneously, the input signals supplied to the liquid crystal drive IC 201A are output from the terminals, which output input signals without any change, and are supplied to the COF reinput terminals 217 through the reinput signal lines 216. The input signals supplied to the COF reinput terminals 217 are supplied to the COF input terminals 215 of the adjacent COF substrate 220 through the COF connection lines 213-2 of the TFT glass substrate 8.

Therefore, the input signals supplied from the control circuit board 228 are sequentially supplied to the adjacent COF substrates one after another via the internal lines 213-1 and 213-2 provided on the TFT glass substrate 208 and the input signal lines 214 and the reinput signal lines 216 provided on the COF substrate 220.

As mentioned above, in the present embodiment, the input signals can be supplied to the COF input terminals 215 through the through lines 221 formed on the COF substrate 220 and the signal return lines 224 formed on the TFT glass substrate 208 without using the FPC cable for input signals. Therefore, the input signals from the control circuit 229 can be supplied to the liquid crystal display device without using the input line printed circuit board 210 and the FPC cable 212 shown in FIG. 35. Thereby, the number of manufacturing processes of the liquid crystal display device can be reduced, and components cost can be cut down.

Figure 40:
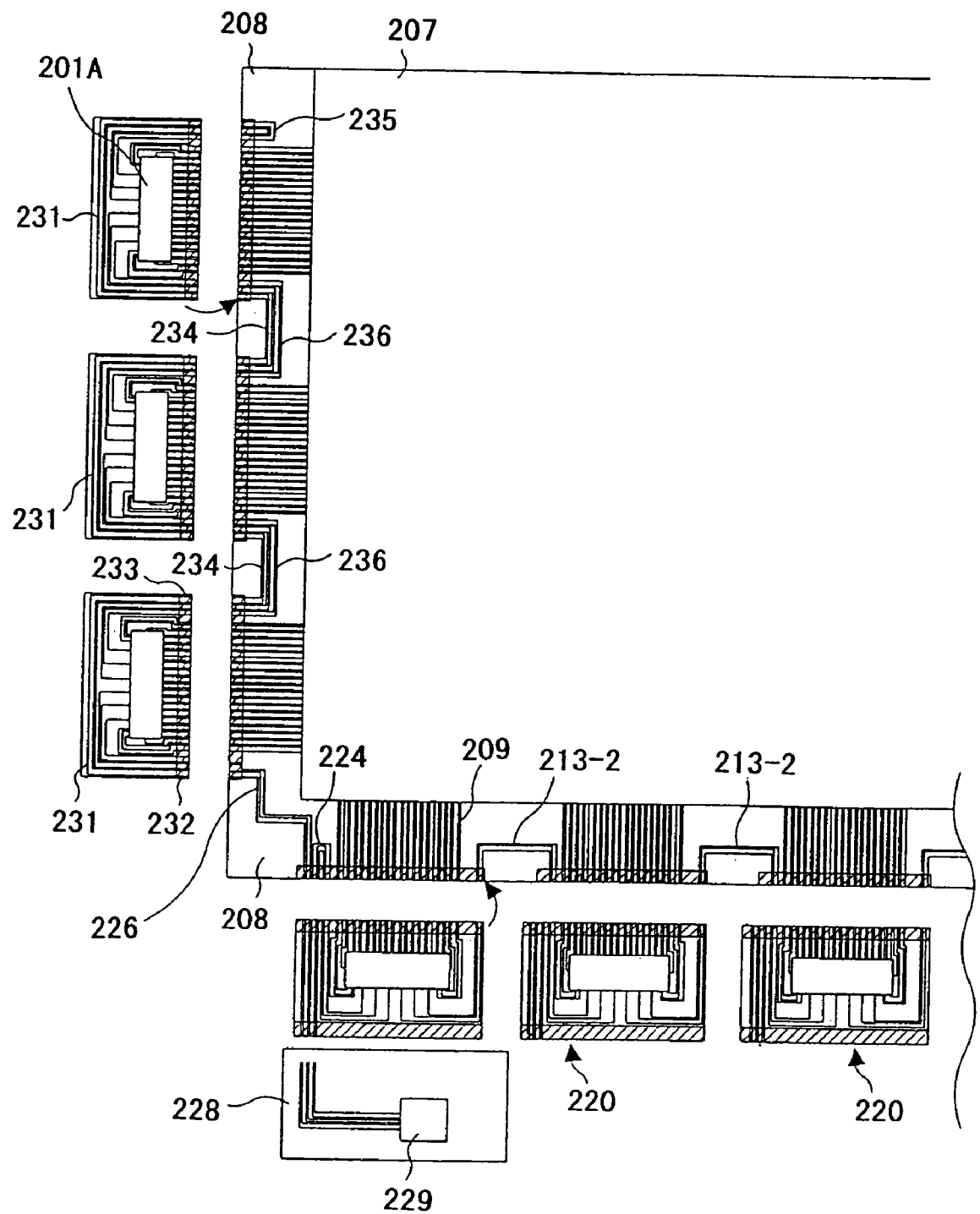
FIG. 40 is an illustration for explaining an input signal supply path in a liquid crystal display device according to a seventh embodiment of the present invention.
Figure 41:
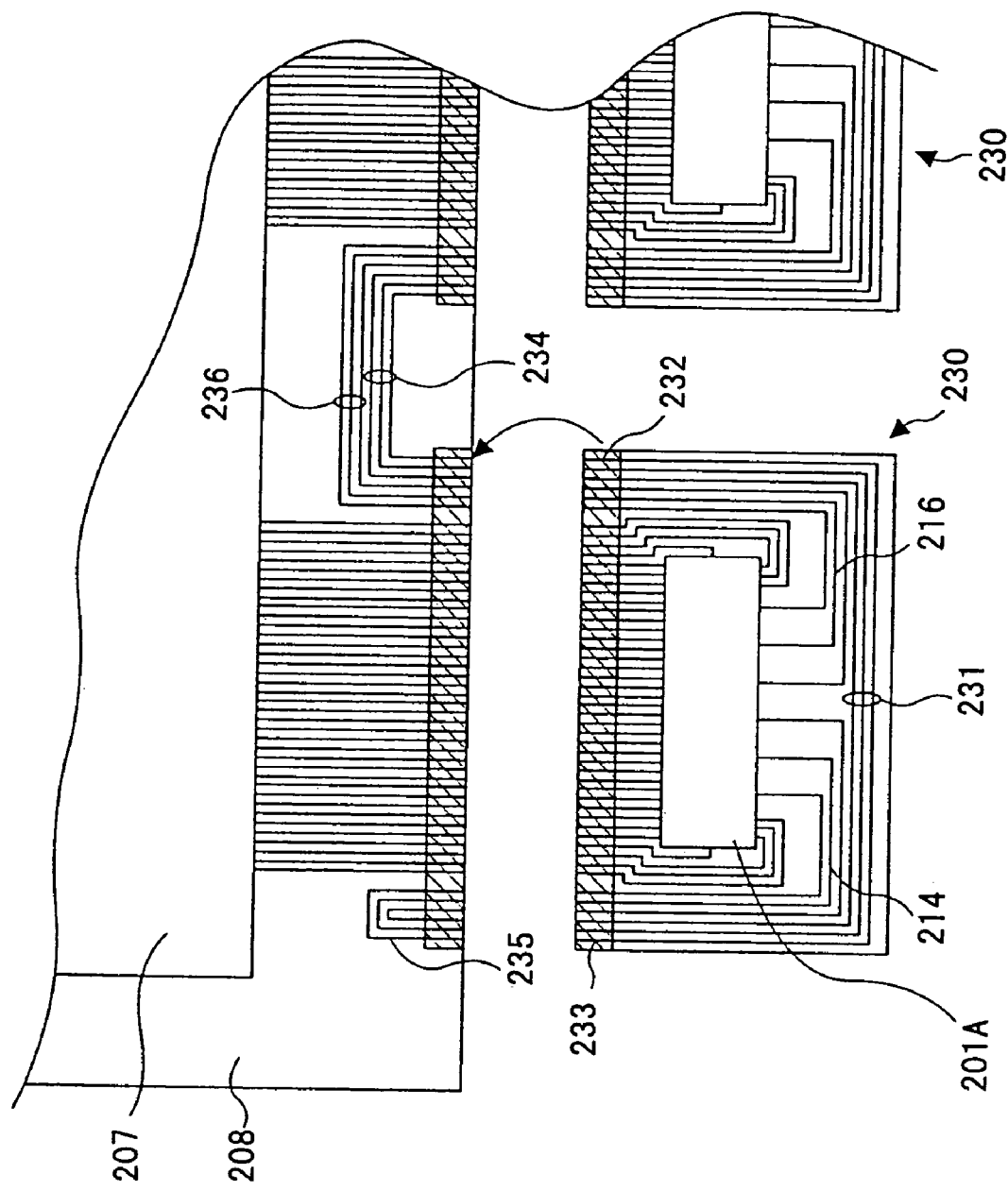
FIG. 41 is an enlarged view of a part of the liquid crystal display device shown in FIG. 40.

A description will now be given of a seventh embodiment of the present invention. FIG. 40 is an illustration for explaining an input signal supply path in the liquid crystal display device according to the seventh embodiment of the present invention. FIG. 41 is an enlarged view of a part of the liquid crystal display device shown in FIG. 40. In FIGS. 40 and 41, parts that are the same as the parts shown in FIG. 37 are given the same reference numerals, and descriptions thereof will be omitted.

The liquid crystal display device according to the present embodiment has a source-side input signal path the same as that of the above-mentioned sixth embodiment but has a different gate-side input signal path.

In the present embodiment, the input signals supplied to the gate side are also supplied to the TFT glass substrate 208 through the COF substrate 220 of the source side. The gate-side input signals are supplied to the gate-side COF substrate 230 through gate-source lines 226 formed on the TFT glass substrate 208.

A plural number of the gate-side COF substrates 230 are connected to the TFT glass substrate 208 in a state where they are arranged along a side of the TFT glass substrate. It should be noted that according to a display approach of a general liquid crystal display device, the source-side input signals are supplied to the TFT glass substrate 208 sequentially from left to right in FIG. 40. Additionally, the gate-side input signals are generally supplied to the TFT glass substrate 208 sequentially from top to bottom in FIG. 40. Thus, in the structure shown in FIG. 40, since the gate-side input signals are supplied from the bottom part of the liquid crystal display device, the gate-side input signals must be introduced into the uppermost COF substrate 230 first.

Then, in the present embodiment, the gate-side input signals are first supplied to the uppermost COF substrate 230 by providing the COF through lines 231 to each of the COF substrates 230 and providing the COF connection lines 234 to the TFT glass substrate 208. The ends of through lines 231 are provided with the through line input terminals 232. The through lines 231 extended along the periphery of the COF substrate from the through line input terminals 232, and are connected to the through line output terminals 233 provided on the side opposite to the side on which the through line input terminals 232 are provided.

Figure 42:
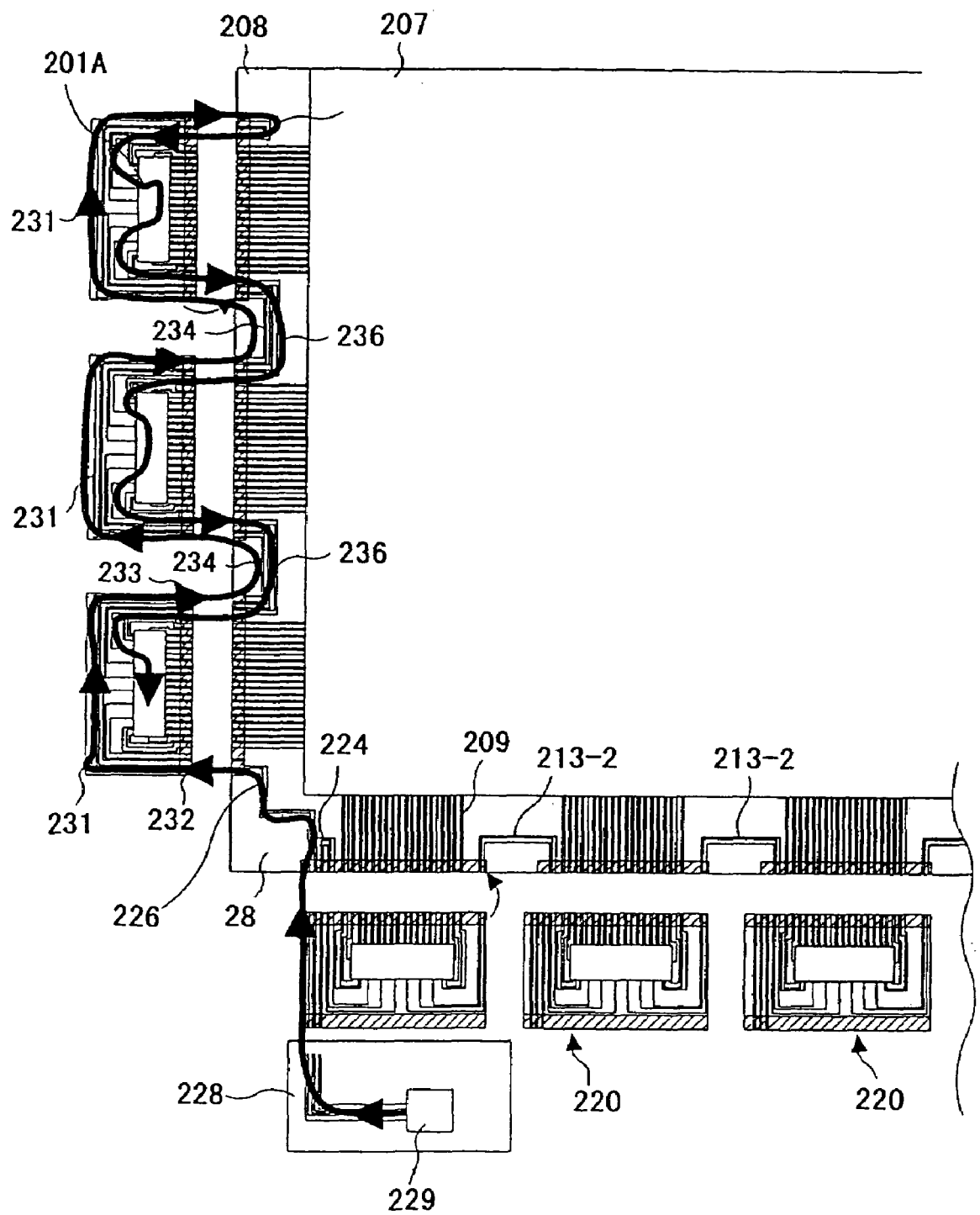
FIG. 42 is an illustration in which a signal path of the gate-side input signals is indicated by arrows.

Like the source-side input signals, the gate-side input signal supplied to the uppermost TFT glass substrate 8 are returned to the uppermost COF substrate 230 by the signal return lines 235, and then supplied to the lower COF substrates 230 one after another through the through lines 236 of the TFT glass substrate 208. FIG. 42 is an illustration in which the signal path of the gate-side input signals is indicated by arrows.

As mentioned above, according to the present embodiment, similar to the above-mentioned sixth embodiment, the input signals can be supplied to the COF input terminals 215 through the through line 221 formed on the COF substrate 220 add the signal return line 224 formed on the TFT glass substrate 230 without using the FPC cable for input signals. Therefore, the input signals from the control circuit can be supplied to the liquid crystal display device without using the input line printed circuit board 210 and the FPC cable 212 shown in FIG. 35. Thereby, the number of manufacturing processes of the liquid crystal display device can be reduced, and components cost can be cut down. In addition, since the gate-side input signals and the source-side input signals can be supplied through only one of the COF substrates, the number of manufacturing processes of the liquid crystal display device can be reduced further, and components cost can be cut down. Moreover, for example, even if the source-side input signals are supplied from the bottom of the display, the source-side input signals can be introduced into the top of the display by the through lines of the COF substrates and the COF connection lines of the TFT glass substrate, thereby improving a freedom of design of the input signal lines.

It should be noted that although the gate-side input signals are transferred from the bottom to the top of the display first in the above-mentioned sixth embodiment, the signal path of the source-side input signals may also be formed in the same manner.

Moreover, although the COF substrates are used as flexible boards on which liquid crystal drive ICs are mounted in the above-mentioned sixth embodiment and the seventh embodiment, TAB substrates may be used instead of the COF substrates.

The present invention is not limited to the specifically disclosed embodiments, and variations and modifications may be made without departing from the scope of the present invention.

The present application is based on Japanese priority applications No. 2001-165564 filed on May 31, 2001, No. 2001-302987 filed on Sep. 28, 2001 and No. 2001-388173 filed on Dec. 20, 2001, the entire contents of which are hereby incorporated by reference.

What is claimed is:

1. A liquid crystal display apparatus comprising:
a glass substrate having a liquid display part formed thereon;
a plurality of flexible boards connected to a periphery of said glass substrate, a liquid crystal drive IC being mounted on each of said flexible boards so as to generate liquid crystal drive signals based on input signals,
wherein said glass substrate has first internal lines and second internal lines, the first internal lines for supplying the input signals supplied from a first one of said flexible boards to a second one of said flexible boards, the second internal lines for returning the input signals supplied from said first one of said flexible boards back to said first one of said flexible boards without any change.

2. The liquid crystal display apparatus as claimed in claim 1, wherein one of said flexible boards has through lines for supplying the input signals supplied from an external circuit to said glass substrate without any change.

3. The liquid crystal display apparatus as claimed in claim 1, wherein each of said flexible boards has through lines for returning the input signals supplied from said glass substrate to said glass substrate without any change.

4. The liquid crystal display apparatus as claimed in claim 2, wherein said through lines extend along a straight line from a first side of said flexible board to a second side of said flexible board.

5. The liquid crystal display apparatus as claimed in claim 4, wherein said first side is opposite of said second side.

6. The liquid crystal display apparatus as claimed in claim 4, wherein said through line includes an input terminal at a first end, which is configured to be connected to the external circuit, and an output terminal at a second end, which is configured to be connected to a signal line on the glass substrate.

7. The liquid crystal display apparatus as claimed in claim 5, wherein said through line includes an input terminal at a first end, which is configured to be connected to the external circuit, and an output terminal at a second end, which is configured to be connected to a signal line on the glass substrate.

* * * * *